United States Patent
Esaki et al.

Patent Number: 5,227,746
Date of Patent: Jul. 13, 1993

[54] LAMINATE LC FILTER HAVING COMBINED CONDENSER AND COIL FUNCTIONS

[75] Inventors: Mitsunobu Esaki; Shigefumi Kimura; Chiharu Miyazaki; Sunao Hiraki; Katsumi Tomiyama; Naoto Oka, all of Kamakura; Hironobu Tsutsumi; Sachio Igawa, both of Sagamihara; Toshio Ootake; Mitsuhiko Kanda, both of Kamakura, all of Japan

[73] Assignee: Mitsubishi Denki Kabushiki Kaisha, Tokyo, Japan

[21] Appl. No.: 824,605

[22] Filed: Jan. 23, 1992

[30] Foreign Application Priority Data

Jan. 23, 1991 [JP] Japan .................. 3-006460
Apr. 17, 1991 [JP] Japan .................. 3-85211
Dec. 9, 1991 [JP] Japan .................. 3-32443

[51] Int. Cl.$^5$ ............................................. H03H 7/01
[52] U.S. Cl. ................................... 333/185; 333/184; 336/200
[58] Field of Search ............... 333/181, 177, 184, 185, 333/12, 167; 336/200, 232; 361/328, 330

[56] References Cited

U.S. PATENT DOCUMENTS

| | | | |
|---|---|---|---|
| 4,048,593 | 9/1977 | Zillman | 333/185 X |
| 4,754,242 | 6/1988 | Okamura et al. | 333/177 X |
| 5,051,712 | 9/1991 | Naito et al. | 333/185 |
| 5,126,707 | 6/1992 | Ikeda | 333/185 |

FOREIGN PATENT DOCUMENTS 55-102224 7/1980 Japan .
59-139619 8/1984 Japan .
59-212013 11/1984 Japan .

Primary Examiner—Robert J. Pascal
Assistant Examiner—Seung Ham
Attorney, Agent, or Firm—Oblon, Spivak, McClelland, Maier & Neustadt

[57] ABSTRACT

An LC filter is provided which includes a first conductive sheet, a first dielectric sheet laminated on the first conductive sheet, a second conductive sheet laminated on the first dielectric sheet, a second dielectric sheet laminated on the second conductive sheet, a third conductive sheet laminated on the second dielectric sheet, and a third dielectric sheet laminated on a third conductive sheet formed as an integral body which has the first, the second and the third conductive sheets and the first, the second and the third dielectric sheets, are coiled. The first and the second conductive sheets are respectively provided with input terminals and output terminals.

3 Claims, 33 Drawing Sheets

LAMINATE LC FILTER HAVING COMBINED CONDENSER AND COIL FUNCTIONS

The present invention relates to an LC filter which is a composite part combining condenser and coil functions.

FIGS. 101, 102 and 103 show a conventional noise filter which is disclosed, for instance, in Japanese Unexamined Patent Publication No. 316013/1989. FIG. 101 is an exploded view of film sheets, FIG. 102, a perspective view showing a state in which the film sheets are laminated and coiled, and FIG. 103, an equivalent circuit diagram.

In FIGS. 101, 102 and 103, reference numerals 20a and 21a designate first terminals, 41a and 41b, second terminals, and 22a and 23a, third terminals. Reference numerals 43, 1a, 47a, 47b and 2a designate conductive foils, and 4, 45a and 45b, film sheets. In FIG. 102, a reference numeral 19 designates a coil, and 17, a core insertion hole. In FIG. 103, reference numerals 10, 11 and 12 designate condensers, 7 and 8, inductances. In FIG. 101, the conductive foil 1a is laminated on the film sheet 4, and the terminal 20a and the other terminal 21a are fixed on the conductive foil 1a, respectively, by the conductive foils 43, by which a first electrode is composed. The conductive foils 47a and 47b are laminated on the film sheets 45a and 45b, respectively, and the other terminal 41a is fixed on the conductive foil 47a by the conductive foil 43, by which a second electrode is composed. The other terminal 41b is fixed on the conductive foil 47b by the conductive foil 43, by which a third electrode is composed. The conductive foil 2a is laminated on the film sheet 4, and the terminal 22a and the other terminal 23a are fixed on the conductive foil 2a, by the conductive foils 43, by which a fourth electrode is composed. Next, the second electrode and the third electrode are laminated on both ends of the fourth electrode, on which the first electrode is laminated. As shown in FIG. 102, the film sheets and the conductive foils which are respectively connected to the first electrodes, the second electrodes, the third electrodes and the fourth electrodes, are laminated and coiled around the core insertion hole 17.

This noise filter having the above construction in which single bodies of coil and condenser parts are not combined, and in which the film sheets and the conductive foils are simultaneously coiled, can have a function combining a coil and a condenser. Accordingly, in the equivalent circuit of FIG. 103 the inductance 7 is formed by winding up the conductive foil 1a, and similarly the inductance 8 is formed by the conductive foil 2a. The condenser 10 is formed by the conductive foils 47a and 47b, the conductive foil 1a and the film sheet 4, and similarly the condenser 11 is formed by the conductive foils 47a and 47b, the conductive foil 2a, and the film sheets 45a and 45b. Furthermore, the condenser 12 is formed by the conductive foil 1a, the film sheet 4, and the conductive foil 2a.

Since the conventional filter is composed as above, a distributed capacity is generated among the layers of the coiled conductive foils, which causes deterioration of high-frequency characteristic of the inductance, and deterioration of the filter characteristic. Since the filter is produced by coiling a plurality of laminated conductive foils and film sheets, the production of the filter is difficult. Furthermore, automation of the production process is difficult since the process requires a step for taking out the terminals. Furthermore, since the setting of the respective constants of the inductance and the condenser which determine the filter characteristic, is mainly performed by selecting a coiled length of the conductive foils and the film sheets, the control of the setting is difficult.

It is an object of the present invention to provide an LC filter capable of solving the above problems, by which an LC filter is obtained which is improved in its high-frequency characteristic, and an LC filter is obtained in which the method of the production is comparatively simple, and an LC filter is obtained in which the automation of production becomes possible, and the filter characteristic can easily be set.

According to an aspect of the present invention, there is provided an LC filter which comprises:

a first conductive sheet; a first dielectric sheet laminated on the first conductive sheet; a second conductive sheet laminated on the first dielectric sheet; a second dielectric sheet laminated on the second conductive sheet; a third conductive sheet laminated on the second dielectric sheet; and a third dielectric sheet laminated on a third conductive sheet;

wherein an integral body consisting of the first, the second and the third conductive sheets and the first, the second and the third dielectric sheets, is coiled; and the first and the second conductive sheets are respectively provided with input terminals and output terminals and the third conductive sheet is provided with another terminal for connection to ground.

According to another aspect of the present invention, there is provided a unit LC filter for laminating which comprises:

a first and a second conductive sheet each having a ring-like shape of which a portion is cut off from an inner opening thereof to an outer periphery thereof; and a dielectric film interposed between the first and the second conductive sheets;

wherein the first and the second conductive sheets are respectively provided with input terminals and output terminals.

According to another aspect of the present invention, there is provided a unit LC filter for laminating of the above aspect, wherein the input terminals and the output terminals are respectively provided at each of edges of the cut-off portions of the first and the second conductive sheets and on radial lines passing through centers of the first and the second conductive sheets.

According to another aspect of the present invention, there is provided a unit LC filter for laminating which comprises:

a first laminated body wherein a plurality of ring-like conductive sheets and a plurality of dielectric sheets a portion of each of which is cut off from an inner opening thereof to an outer periphery thereof are alternatively laminated shifting the cut-off portions of the conductive sheets and the dielectric sheets; and a second laminated body composed in the same way as in the first laminated body;

wherein first ends of the cut-off portions of the first laminated body are laminated and connected to second ends of the cut-off portions of the second laminated body. According to another aspect of the present invention, there is provided a unit LC filter for laminating which comprises:

a first and a second conductive sheet a portion of each of which is cut off from an inner opening thereof to an outer periphery thereof; and a magnetic sheet interposed between the first and the second conductive sheets;

wherein the first and the second conductive sheets are provided with input terminals and output terminals, respectively.

Furthermore, as shown in the embodiments (mentioned later), the following laminating means may be provided for multi-layer type LC filters.

A multi-layer filter is provided wherein unit layer LC filters are laminated in multiple layers interposing dielectric films, and connection terminals provided at edges of the cut-off portions of the first and second conductive sheets are successively connected, by which the respective conductive sheets are connected forming a coil-like connection.

A multi-layer LC filter is provided, wherein the unit layer LC filters each provided with a third conductive sheet interposing a dielectric film, are laminated in multiple layers interposing dielectric films, and connection terminals provided at edges of the cut-off portions of the first and the second conductive sheets are successively connected, by which the respective conductive sheets are connected forming a coil, and the third conductive sheets are connected to each other.

A multi-layer LC filter is proposed in which a laminated body wherein magnetic sheets are inserted among the first, the second and the third conductive sheets, and the integral body is laminated interposing magnetic sheets, and another laminated body wherein magnetic sheets and dielectric films are interposed among the first, the second and the third conductive sheets, are laminated interposing magnetic sheets and dielectric films.

A multi-layer filter is proposed in which a multi-layer filter wherein unit layer LC filters composed of the first and second conductive sheets and dielectric films interposed therebetween, are laminated in arbitrary number, and another multi-layer filter wherein a third conductive sheet is laminated on the above unit layer LC filter interposing a dielectric film, are laminated in arbitrary number interposing dielectric films, and both multi-layer filters are laminated.

Furthermore, a plurality of conductive sheets are provided each having an opening at a central portion thereof, a cut-off portion provided from the opening to a periphery thereof and terminals at the cut-off portions, and a plurality of dielectric films are provided each having a protrusion or a recess or a hole for connecting top and bottom conductive sheets and also for positioning. The connecting terminal provided at one cut-off edge of a conductive sheet communicates with the other terminal of the other cut-off edge of another conductive sheet by contact thereto or by a conductive adhesive agent. Filters wherein two pairs of the connected conductive sheets are alternatively laminated, and the dielectric sheets are inserted between the conductive sheets, are laminated in a single step or in multi-steps, and connected in series from the first layer to the Nth layer, by contact or by a conductive adhesive agent.

Furthermore, the LC filter is composed of two-face-substrates, wherein a pattern thickness of the bottom surface of the two-face-substrate is larger than that of the top surface by the thickness of the dielectric film, and the substrates are laminated in a single step or in multi-steps, and are connected in series from the first to the Nth layers.

Furthermore, an LC filter is composed by connecting the first filter wherein filters in which the conductive sheets are connected in parallel, are laminated in a single step or in multi-steps from the first to the Nth layer, in parallel, the second filter wherein the other conductive sheets are provided between the respective layers of the LC filter, mentioned above and the other conductive sheets are grounded, and the LC filter, mentioned above, are connected in series, and equipped with a core, if necessary.

IN THE DRAWINGS

EMBODIMENT 1

Figure 1:
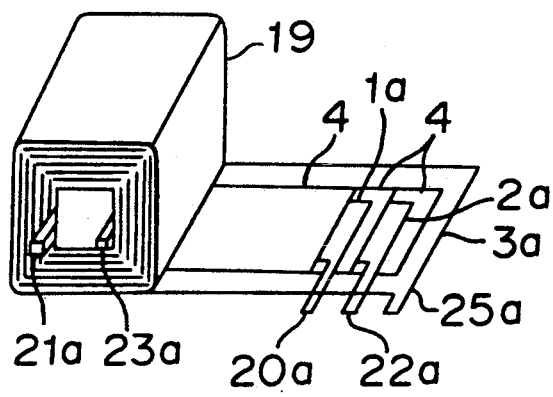
FIG. 1 is an exploded view of an embodiment 1 according to the present invention.

FIGS. 1, 2, 3 and 4 are an exploded view, a diagram showing a layer construction, an equivalent circuit diagram and a perspective view showing appearance of an embodiment of this invention, respectively. In FIG. 1, notations $1a$, $2a$ and $3a$ designate respectively a first, a second and a third conductive foil, and 4, a dielectric film. A numeral 19 designates a coil formed by coiling the above elements. Notations $20a$, $21a$, $22a$, $23a$ and $25a$ respectively designate terminals.

The coil 19 is formed in the following way. The dielectric film 4 is laminated on the conductive foil $3a$ having the terminals $25a$, on which the conductive foil $2a$ having the terminals $22a$ and $23a$, the dielectric film 4, the conductive foil $1a$ having the terminals $20a$ and $21a$, and the dielectric film 4, are successively laminated. The laminated body is coiled, by which the coil 19 is obtained.

Figure 2:
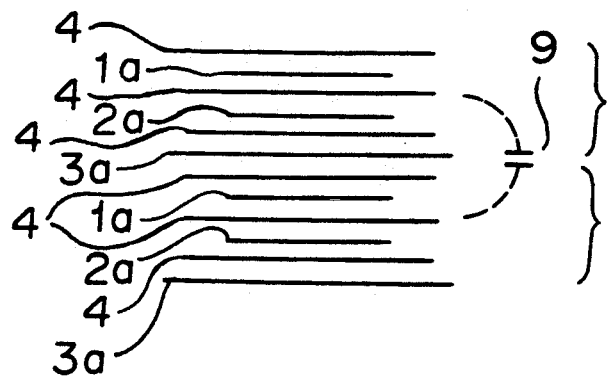
FIG. 2 is a diagram showing a layer construction of the embodiment 1 according to the present invention.
Figure 3:
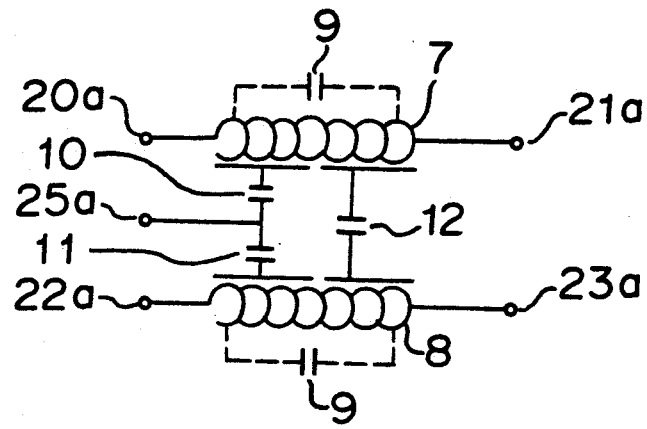
FIG. 3 is an equivalent circuit diagram of the embodiment 1 according to the present invention.
Figure 4:
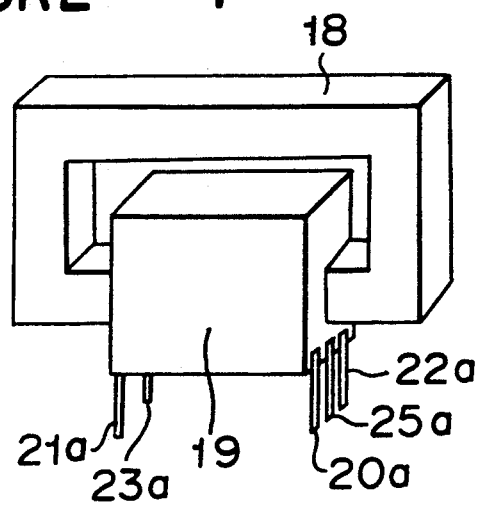
FIG. 4 is a perspective view of the embodiment 1 according to the present invention.

FIG. 2 is a diagram showing a layer construction of the coil 19 in which the conductive foils $1a$, $2a$ and $3a$, and the dielectric films 4 are coiled. In FIG. 2, a numeral 9 designates a distributed capacity generated among the layers of the coiled conductive foils. In FIG. 3, numerals 10, 11 and 12 designate condensers, and 7 and 8, inductances. FIG. 4 shows the appearance of the LC filter, in which a numeral 18 designates a core made of ferrite or the like.

Figure 5:
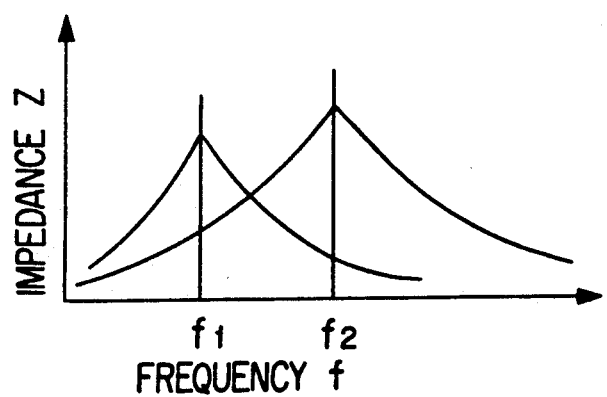
FIG. 5 is a diagram showing an impedance characteristic of the embodiment 1 according to the present invention.

The inductances 7 and 8 in FIG. 3, are respectively formed by the coiled conductive foils $1a$ and $2a$, and the electrostatic capacitance 12 is formed by the conductive foil $1a$, the dielectric film 4, and the conductive foil $2a$. Furthermore, the electrostatic capacitance 10 is formed by the conductive foils $1a$ and $3a$ and the dielectric film 4 interposed between the conductive foils, and similarly, the electrostatic capacitance 11 is formed by the conductive foils $2a$ and $3a$ and the dielectric film 4 interposed between the conductive foils. In such an LC filter, as shown in FIG. 2, the distributed capacity 9 is formed among layers of the coil. This distributed capacity is formed in parallel with the inductances 7 and 8 as shown in FIG. 3. Since in this embodiment, the conductive foil $3a$ is provided as well as the conductive foils $1a$ and $2a$, and the conductive foil $3a$ is coiled simultaneously with the other foils, the conductive foil $3a$ shields between the layers in the coil 19, and can reduce the inter layer distributed capacity 9. FIG. 5 is a characteristic diagram showing an impedance between the terminals 20a and 21a in FIG. 3. The ordinate shows the impedance Z, and the abscissa, the frequency f, in which $f_1$ is a resonance frequency in case of being devoid of the conductive foil 3a, and $f_2$, a resonance frequency according to the present invention. The resonance frequency of a circuit having a coil and a condenser can be shown by the equation $f = \frac{1}{2\pi\sqrt{LC}}$. By reducing the distributed capacity C, the resonance frequency can be increased from $f_1$ to $f_2$, which enables the improvement of the frequency characteristic of the LC filter. Furthermore, it is possible to enhance the effect of reducing the distributed capacity, by enlarging the width of the conductive foil 3a compared with those of the conductive foils 1a and 2a.

EMBODIMENT 2

The LC filter can be a common mode filter, by making the terminal 25a of the conductive foil 3a in the above Embodiment 1, a grounded terminal.

EMBODIMENT 3

Figure 6:
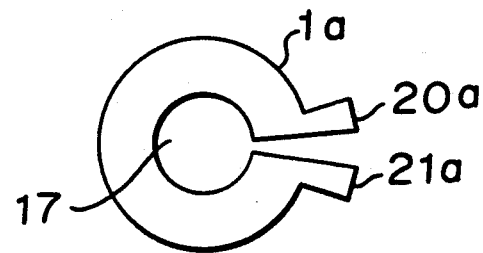
FIG. 6 is a plan showing a conductive sheet of an embodiment 3 according to the present invention.
Figure 7:
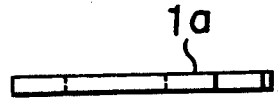
FIG. 7 is a front view of the conductive sheet of the embodiment 3 according to the present invention.
Figure 8:
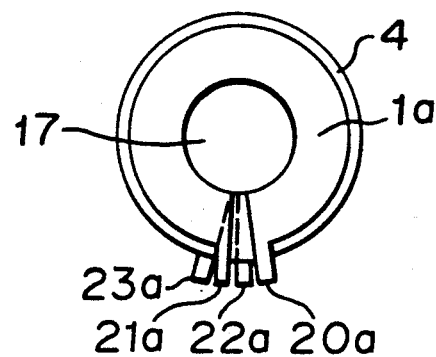
FIG. 8 is a plan of a unit layer LC filter of the embodiment 3 according to the present invention.
Figure 9:
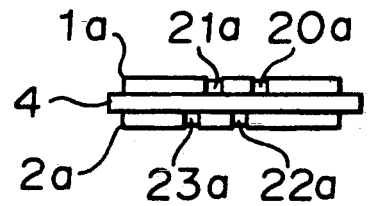
FIG. 9 is a front view of the unit layer LC filter of the embodiment 3 according to the present invention.
Figure 10:
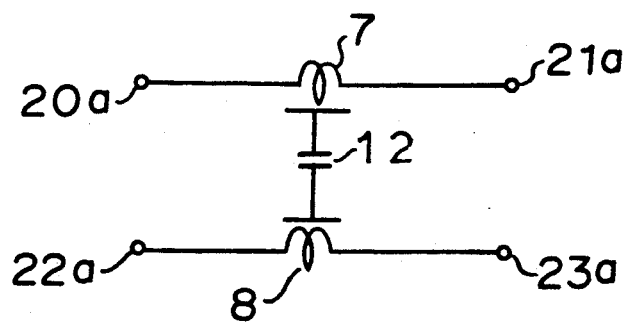
FIG. 10 is an equivalent circuit diagram of the unit layer LC filter of the embodiment 3 according to the present invention.
Figure 11:
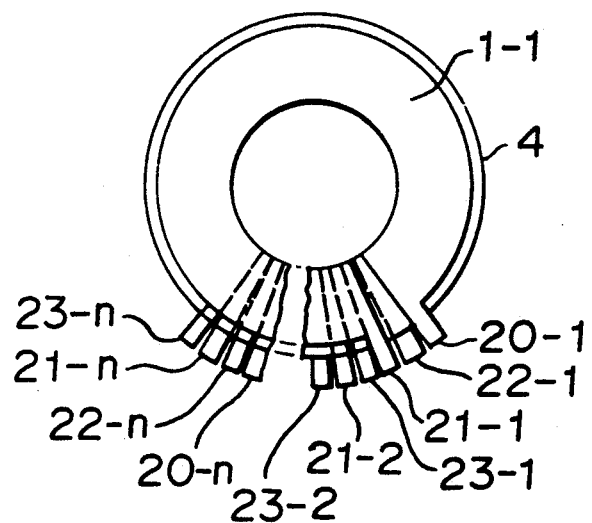
FIG. 11 is a plan showing a multi-layer LC filter of the embodiment 3 according to the present invention.
Figure 12:
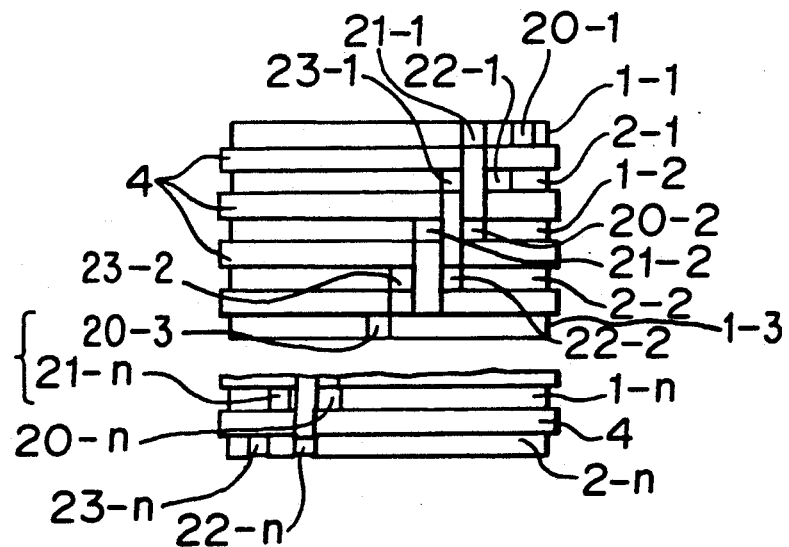
FIG. 12 is a front view of the multi-layer LC filter of the embodiment 3 according to the present invention.
Figure 13:
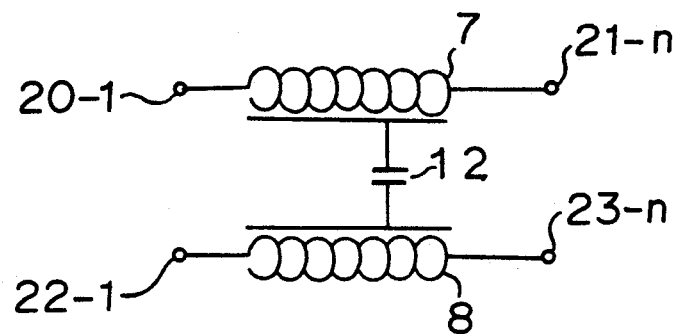
FIG. 13 is an equivalent circuit diagram of the multi-layer LC filter of the embodiment 3 according to the present invention.
Figure 14:
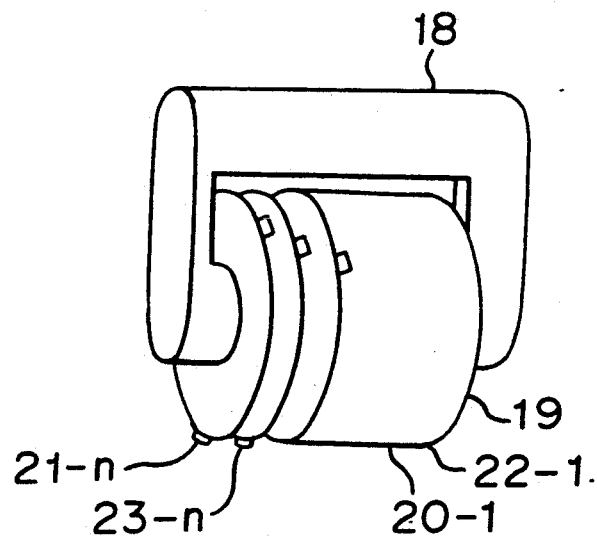
FIG. 14 is a perspective view of the multi-layer LC filter of the embodiment 3 according to the present invention.

FIGS. 6 through 14 are diagrams showing another embodiment of the present invention. FIGS. 6 and 7 show a plan and a front view of the conductive sheet, respectively. FIGS. 8, 9 and 10 are a plan, a front view and an equivalent circuit diagram of a unit layer LC filter, respectively. FIGS. 11, 12 and 13 are a plan, a front view and an equivalent circuit diagram of a multi-layer LC filter in which the above unit layer LC filters are laminated by N layers, respectively. FIG. 14 is a perspective view of the multi-layer LC filter in which a ferrite core is inserted.

In FIGS. 6 and 7, a notation 1a designates a ring-like conductive sheet a portion of which is cut off from an opening to a periphery thereof, 20a, a terminal provided at one cut-off end of the conductive sheet, and 21a, a terminal provided at the other cut-off end of the conductive sheet. A numeral 17 designates a core insertion hole. In FIGS. 8, 9 and 10, a notation 2a designates a ring-like conductive sheet a portion of which is cut off from an opening to a periphery thereof, similar to 1a, and has terminals 22a and 23a, similar to 1a. A numeral 4 designates a ring-like dielectric film, which is sandwiched between the conductive sheets 1a and 2a, for forming a unit layer LC layer shown in the equivalent circuit of FIG. 10. In this occasion, the conductive sheets 1a and 2a are shifted from each other in the circumferential direction so that the terminals 20a and 21a do not contact the terminals 22a and 23a.

Next, a multi-layer LC filter is formed by laminating the unit layer LC filters by N layers, interposing the dielectric films 4 therebetween, and connecting corresponding terminals. In FIGS. 11 and 12, a terminal 21-1 of a conductive sheet 1-1 and a terminal 20-2 of a conductive sheet 1-2, and the other terminal 21-2 of the conductive sheet 1-2 and a terminal 20-3 of a conductive sheet 1-3, are connected. Similarly, the respective corresponding terminals of the respective conductive sheets are connected until a terminal 21-n-1 of a conductive sheet 1-n-1 and a terminal 20-n of a conductive sheet 1-n are connected, by which a first multi-layer coil-like conductive body is formed. Similarly, by connecting conductive sheets of 2-1, 2-2, ..., 2-n-1, and 2-n, a second multi-step coil-like conductive body is formed. As mentioned above, by laminating unit layer LC filters into a multi-layer body, an LC filter is obtained, in which larger values of the condenser 12, and the inductances 7 and 8, shown in the equivalent circuit of FIG. 13, are obtained.

In this embodiment, it is not necessary to laminate and coil the sheet-like conductive foils and dielectric films, as in Embodiments 1 and 2. A multi-layer body is produced by laminating the ring-like conductive sheets and the dielectric films. Therefore, this embodiment has an advantage in which the production of the filter is easy.

Furthermore, in this embodiment, the shape of the dielectric film is ring-like. However, when the core such as a ferrite core is not used, the shape may be a disk-like one. Furthermore, the terminals for connection, can integrally be made with the conductive sheet, or separately made. Dielectric films or insulating films may be provided at the top and the bottom of the filter in FIG. 12.

EMBODIMENT 4

Figure 15:
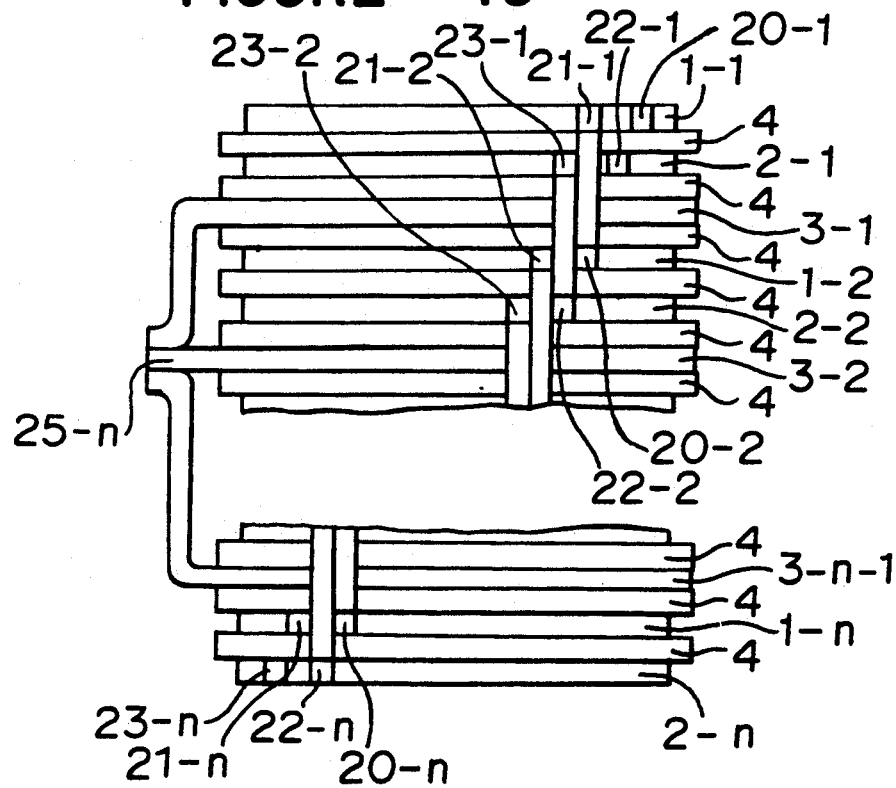
FIG. 15 is a front view of a multi-layer LC filter of an embodiment 4 according to the present invention.
Figure 16:
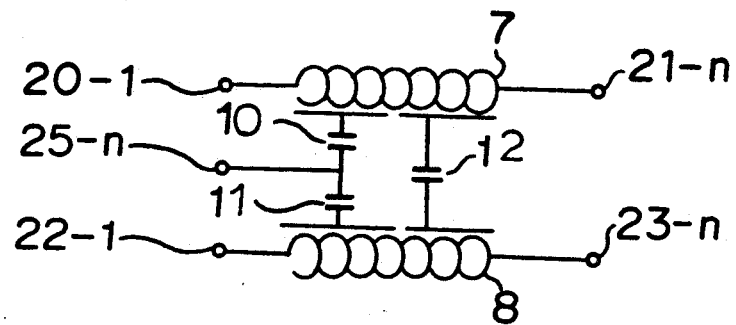
FIG. 16 is an equivalent circuit diagram of the multi-layer LC filter of the embodiment 4 according to the present invention.

FIGS. 15 and 16 show another embodiment of the present invention. In this embodiment, a multi-layer LC filter is composed of N layers of unit LC filters in which third conductive sheets are inserted between the respective unit layer LC filters of the multi-layer LC filter of the embodiment 3, interposing the dielectric films therebetween. FIG. 15 is a front view of the multi-layer LC filter, and FIG. 16 is an equivalent circuit diagram thereof. In FIGS. 15 and 16, notations 3-1, 3-2, ..., 3-n-1 are ring-like third conductive sheets devoid of cut-off portions, which are interposed between the respective unit layer LC filter, interposing the dielectric films 4, and which are connected to the terminal 25-n. The condensers 10 and 11 are formed by the conductive sheets 3-1, 3-2, ..., 3-n-1. The condenser 10 is formed by the first conductive sheets 1-2, 1-3, ..., 1-n, the third conductive sheets 3-1, 3-2, 3-n-1, and the dielectric sheets 4 interposed therebetween. The condenser 11 is formed by the second conductive sheets 2-1, 2-2, ..., 2-n-1, the third conductive sheets 3-1, 3-2, ..., 3-n-1, and the dielectric sheets 4 interposed therebetween.

The conductive sheets 3-1, 3-2, ..., 3-n-1, can reduce the inter-layer distributed capacity and provide an LC filter in which the high frequency characteristic is improved, by shielding among the respective unit layer LC filters. The shielding effect is enhanced by making the size of the conductive sheets larger than those of the first and the second conductive sheets.

Furthermore, when a core such as a ferrite core is not used, the shape of the third conductive sheets 3-1, 3-2, ..., 3-n-1, and the dielectric films 4 may not be a ring-like one and may be a disk-like one. The third conductive sheets or the third conductive sheet having dielectric films or insulating films at the outside thereof, may be provided on the top and the bottom of the filter in FIG. 15.

EMBODIMENT 5

An LC filter can be made to a common mode filter, by making the terminal 25-n of the third conductive sheets of the Embodiment 4, a grounded terminal

EMBODIMENT 6

Figure 17:
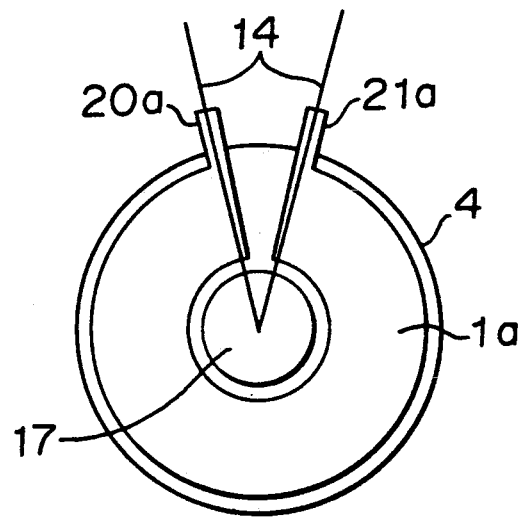
FIG. 17 is a plan showing a laminated body composed of a conductive sheet and a dielectric film of an embodiment 6 according to the present invention.

FIG. 17 is a plan showing a laminated body wherein ring-like conductive sheet portions of which are cut off from openings to peripheries thereof, and dielectric films are laminated. In FIG. 17, a reference numeral 14 designates a radial line drawn from the center of the ring at the edge of the cut-off portion. In this embodiment, a multi-layer LC filter including N layers, of the embodiment 4 is formed, by providing the terminals of the first and the second conductive sheets on the radial lines 14. In this embodiment, no shift is produced between the terminals, when the sheets are laminated in multi-layers, and the corresponding terminals are connected. Therefore, the production thereof is facilitated.

Furthermore, a multi-layer LC filter having no shift, and having tight adherent characteristic, can be produced by mounting conductive sheets and the dielectric films by an adhesive in laminating them.

The perspective view and the equivalent circuit diagram of the multi-layer LC filter of this embodiment, in which a ferrite core is inserted into the central part of the laminated rings, are the same as in FIGS. 14 and 16, respectively.

EMBODIMENT 7

In this embodiment, an integral sheet is produced, which is composed of a dielectric film made of polyester film or polyimide film and a ring-like conductive sheet with terminals as shown in FIG. 17, by using a single-faced flexible substrate and by etching a copper foil portion thereof. By combining a plurality of the integral sheets, a multi-layer LC filter similar to embodiment 6, is produced. In this embodiment, there is an advantage of saving time in production.

EMBODIMENT 8

Figure 18:
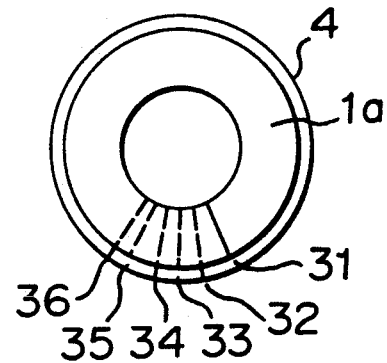
FIG. 18 is a plan of a unit layer LC filter of an embodiment 8 according to the present invention.
Figure 19:
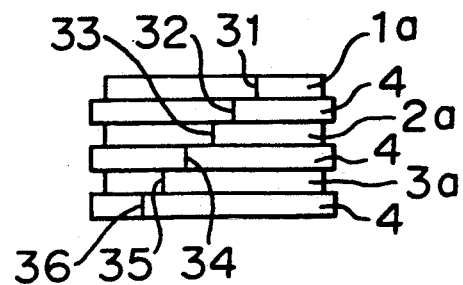
FIG. 19 is a front view of the unit layer LC filter of the embodiment 8 according to the present invention.
Figure 20:
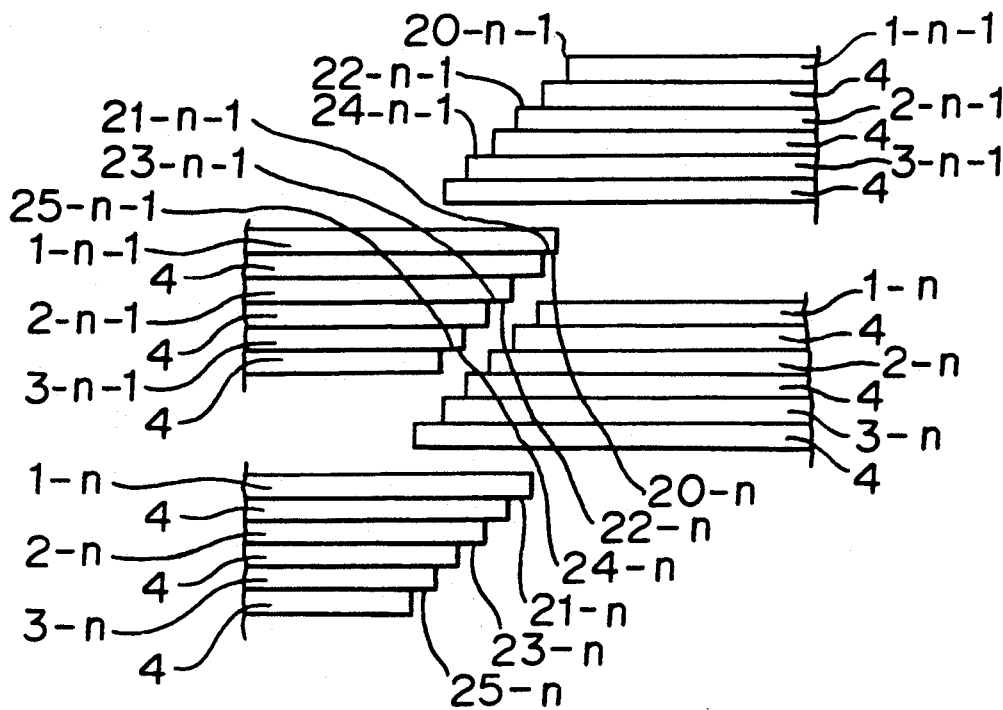
FIG. 20 is a diagram showing a connection of the unit layer LC filters of the embodiment 8 according to the present invention.

In this embodiment, the connection method of respective layers in the multi-layer formation of the multi-layer LC filter having third conductive sheets described in Embodiment 4, is changed. FIGS. 18 and 19 are a plan and a front view showing the construction of the first layer of the unit layer LC filters having the third conductive sheets, respectively. FIG. 20 is a diagram showing the connection state in the multi-layer formation by using the unit layer LC filters, particularly showing the connection of the N-1th layer of the unit layer LC filters and the Nth layer thereof. In FIG. 18, a reference numeral 31 designates a cut-off portion which is cut off along the radial line from the center of the ring-like conductive sheet 1a, 32, another cut-off portion which is cut off along another radial line from the center of the dielectric film 4, which is provided at the position shifted from the portion 31 in circumferential direction by several degrees. Similarly, numerals 33, 34, 35 and 36 are respectively cut-off portions provided along the radial lines from the centers of the conductive sheet 2a, the dielectric film 4, the conductive sheet 3a and the dielectric film 4, being successively shifted by several degrees.

In FIG. 20, a notation 21-n-1 designates a connection terminal of the conductive sheet 1-n-1, which is exposed between the cut-off portions 31 and 32, of the N-1th layer of the unit LC filter, 23-n-1, a connection terminal of the conductive sheet 2 n-1, which is exposed between the cut-off portions 33 and 34 and 25-n-1, a connection terminal of the conductive sheet 3-n-1, which is exposed between the cut-off portions 35 and 36. Similarly, notations 20-n, 22-n and 24-n are connection terminals of the conductive sheets 1-n, 2-n and 3-n of the Nth layer of the unit layer LC filter, respectively. By connecting these connection terminals 21-n-1 and 20-n, 23-n-1 and 22-n, and 25-n-1 and 24-n, the connections among the first conductive sheets, the second conductive sheets and the third conductive sheets can be made, by which the connection between the N-1th layer and the Nth layer of the unit layer LC filter is completed. Similarly, the multi-layer LC filter having N layers can be obtained by connecting the unit layer LC filters from the first layer of the unit layer LC filter to the N-1th layer thereof in the same way as above. The equivalent circuit in this embodiment is as shown in FIG. 16 of Embodiment 4.

According to the embodiment, the connecting positions for multi-layer formation are not exposed outside and can be accommodated inside of the outer surface of the ring-like conductive sheets. Therefore, it is possible to downsize the LC filter.

EMBODIMENT 9

Figure 21:
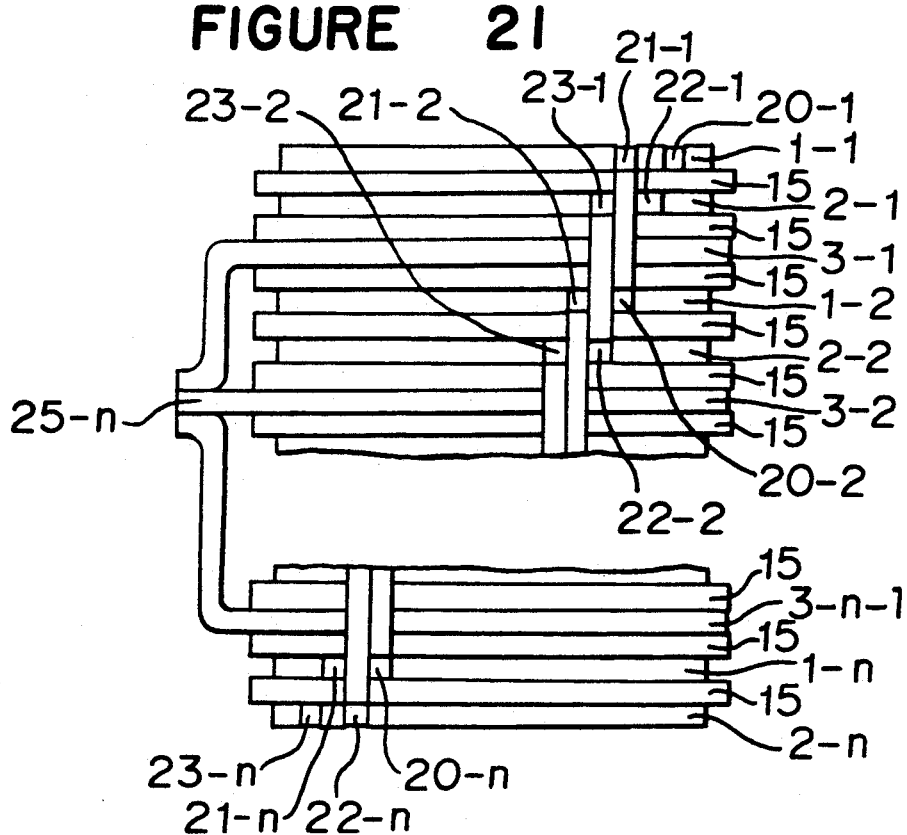
FIG. 21 is a front view of a multi-layer LC filter of an embodiment 9 according to the present invention.
Figure 22:
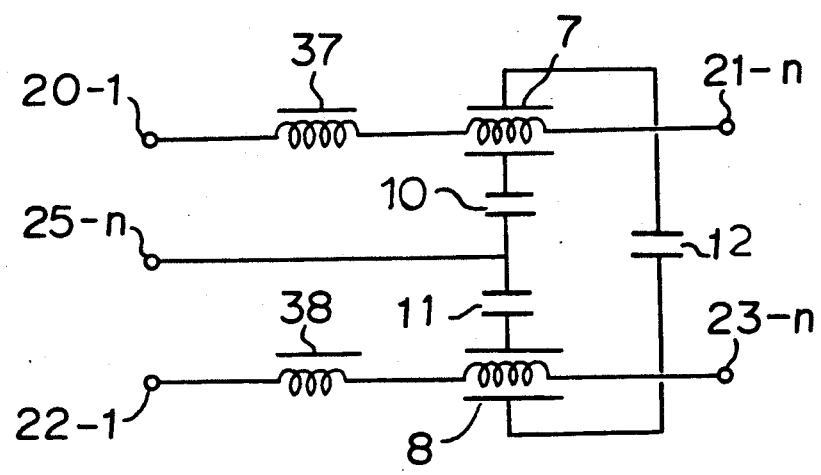
FIG. 22 is an equivalent circuit diagram of the multi-layer LC filter of the embodiment 9 according to the present invention.

As shown in FIG. 21, in this embodiment, non-conductive ring-like magnetic sheets are used replacing the dielectric films 4 in Embodiment 4. In FIG. 21, a reference numeral 15 designates a ring-like magnetic sheet. The equivalent circuit thereof is shown in FIG. 22. By inserting these magnetic sheets, the added-magnetic-beads effect shown by the reference numerals 37 and 38 in the equivalent circuit diagram of FIG. 22, can be obtained. Accordingly, as an LC filter, improvement of the frequency characteristic, particularly, the characteristic improvement in the high frequency domain, is obtained. The condensers 10, 11 and 12 in the equivalent circuit of FIG. 22 are formed by the respective conductive sheets and a dielectric constant of the magnetic sheet therebetween. Of course, when the capacitance of the condenser is insufficient, the dielectric films can be added as in Embodiment 4. For instance, in FIG. 21, the film composition of the embodiment may be one in which the conductive sheet, the magnetic sheet, the dielectric film, the conductive sheet, ..., are iteratively laminated.

As shown in Embodiment 6, the respective composing elements may be bonded by an adhesive agent in laminating thereof, by which shift in laminating layers can be prevented. When the composing elements are bonded by an adhesive agent, in case that insulation between the conductive sheets and the magnetic sheets can be maintained, the magnetic sheet can be selected in wide varieties without being limited to the non-conductive magnetic body.

Furthermore, by composing input terminals and output terminals of the first and the second conductive sheets, as in 20a and 21a of FIG. 17 shown in Embodiment 6, the shift of connecting terminals in the multi-layer formation can be prevented. Also in case of the filter in which the magnetic sheets are interposed, by performing the working of the sheets as shown in Embodiment 8, the connecting means in the multi-layer formation in Embodiment 8 is applicable, and the miniaturization of the LC filter is made possible.

Furthermore, as shown in Embodiment 7, the use of the single-faced flexible substrate is possible.

The appearance of the multi-layer LC filter in which a ferrite core is inserted into the laminated body of the embodiment, is similar to FIG. 14.

EMBODIMENT 10

In this embodiment, a multi-layer LC filter composed of N1 layers of unit layer LC filters in Embodiment 3, is formed. On the other hand, another multi-layer LC filter composed of N2 layers of unit layer LC filters having the third conductive sheets as in Embodiment 4, is formed. Next, a multi-layer LC filter having N1+N2 layers, is formed, by connecting corresponding terminals of the first and the second conductive sheets as in Embodiment 3 or in Embodiment 4, in the above two filters. According to this embodiment, by selecting arbitrarily the laminated layer numbers, N1 and N2, of the above two kinds of multi-layer LC filters, the values of the inductances and the capacitances in the equivalent circuit diagram of FIG. 16, can be changed, by which the characteristic of the LC filter can be set comparatively easily.

A similar multi-layer LC filter can be formed by the multi-layer formation in which the connection is performed inside of the surfaces of the conductive sheets as shown in Embodiment 8.

EMBODIMENT 11

Figure 23:
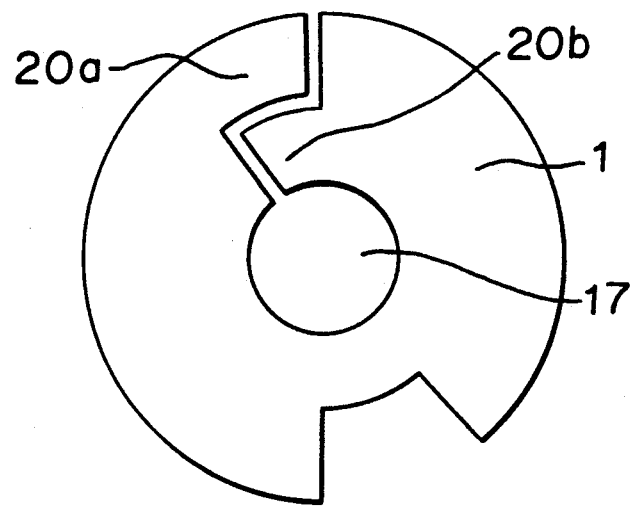
FIG. 23 is a plan of a conductive sheet of an embodiment 11 according to the present invention.
Figure 24:
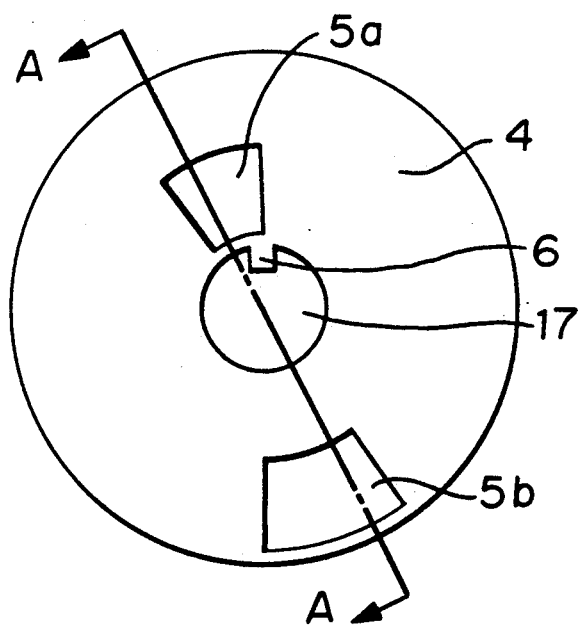
FIG. 24 is a plan of a dielectric film of the embodiment 11 according to the present invention.
Figure 25:
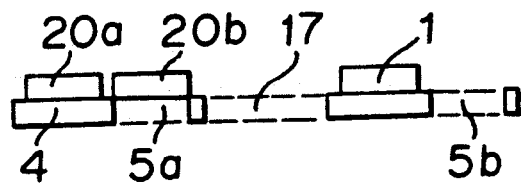
FIG. 25 is a sectional diagram wherein the conductive sheet and the dielectric film of the embodiment 11 are laminated according to the present invention.
Figure 26:
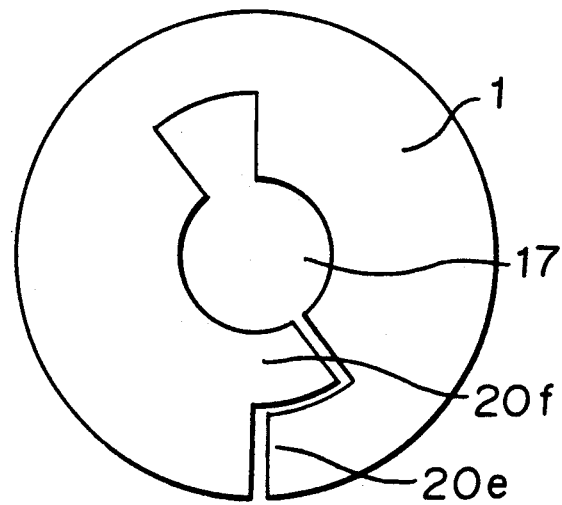
FIG. 26 is a plan of another dielectric sheet of the embodiment 11 according to the present invention.
Figure 27:
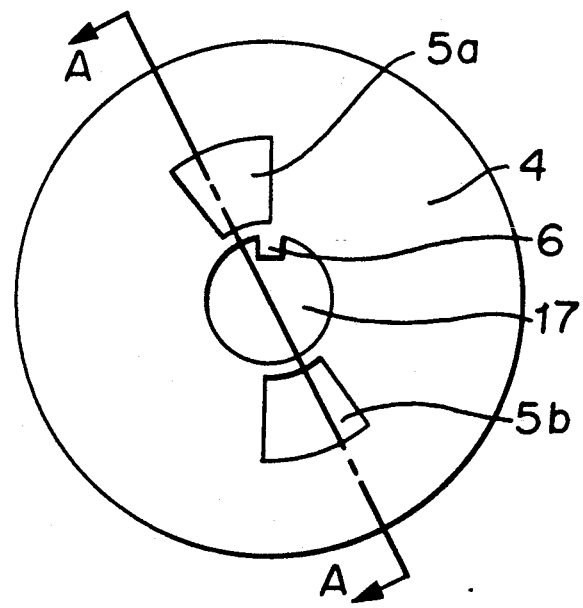
FIG. 27 is a plan of another dielectric film of the embodiment 11 according to the present invention.
Figure 28:
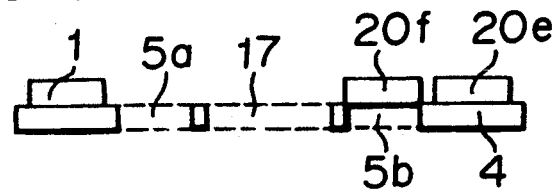
FIG. 28 is a sectional diagram wherein the conductive sheet and the dielectric film of the embodiment 11 are laminated according to the present invention.
Figure 29:
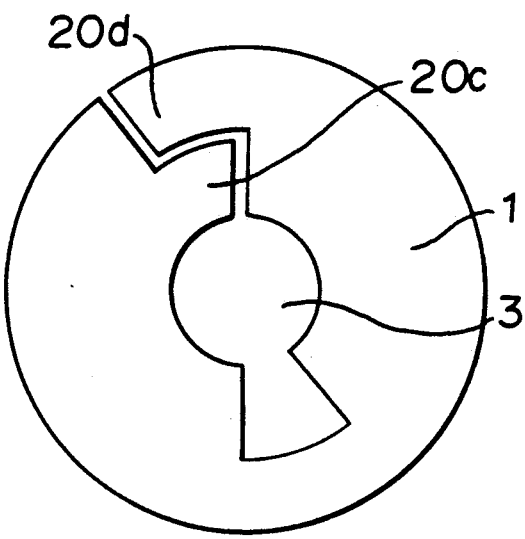
FIG. 29 is a plan of another conductive sheet of the embodiment 11 according to the present invention.
Figure 30:
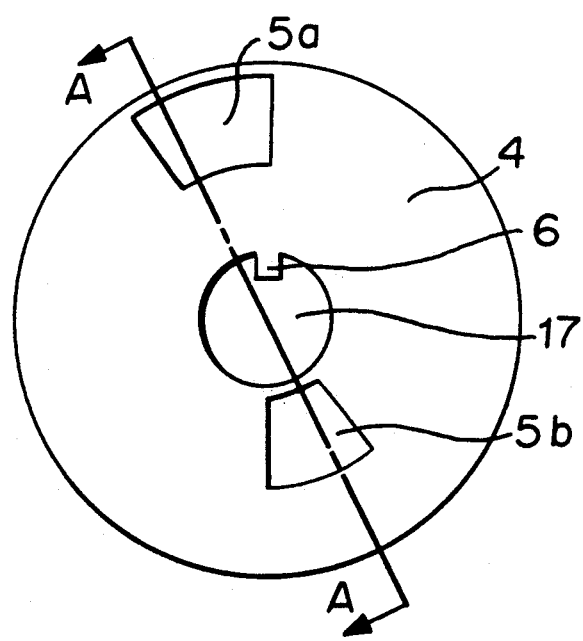
FIG. 30 is a plan of another dielectric film of the embodiment 11 according to the present invention.
Figure 31:
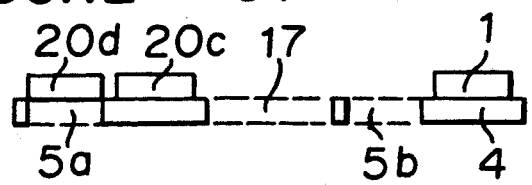
FIG. 31 is a sectional diagram wherein the conductive sheet and the dielectric film of the embodiment 11 are laminated according to the present invention.
Figure 32:
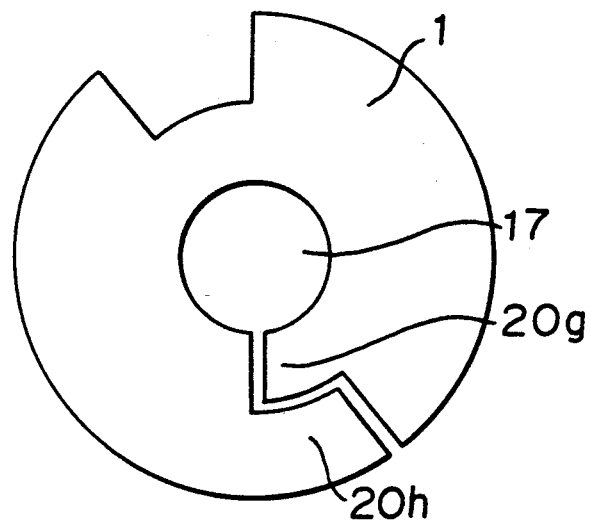
FIG. 32 is a plan of another conductive sheet of the embodiment 11 according to the present invention.
Figure 33:
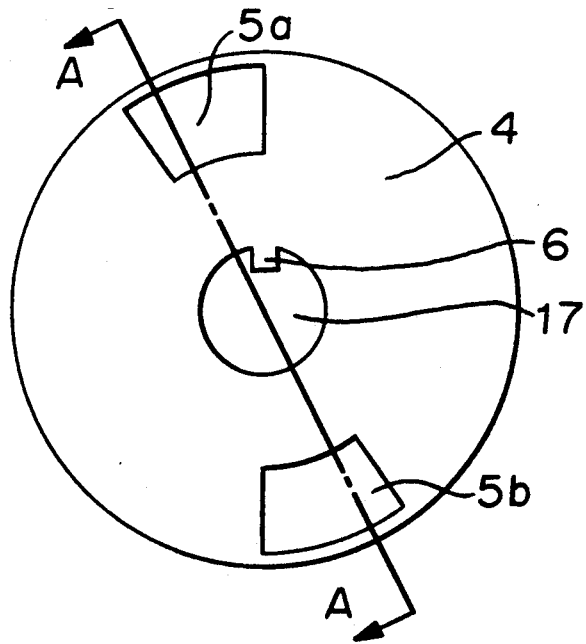
FIG. 33 is a plan of another dielectric film of the embodiment 11 according to the present invention.
Figure 34:
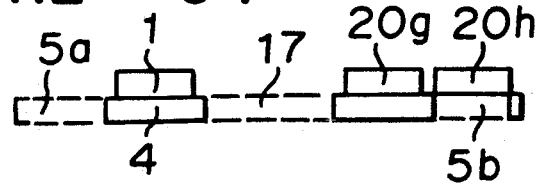
FIG. 34 is a sectional diagram wherein the conductive sheet and the dielectric film of the embodiment 11 are laminated according to the present invention.
Figure 35:
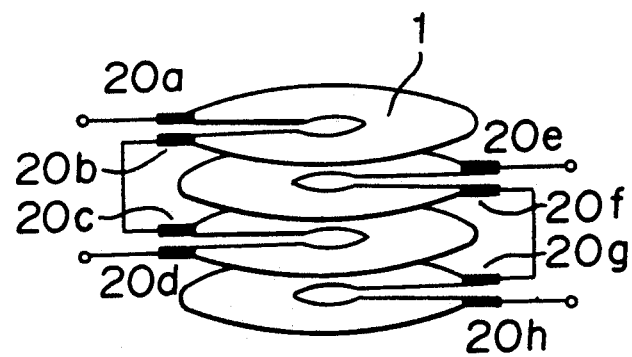
FIG. 35 is a connection diagram of the conductive sheets of the embodiment 11 according to the present invention.

FIG. 23 is a plan showing an example of a conductive foil according to the present invention, FIG. 24, a plan of a dielectric film, and FIG. 25, a sectional diagram taken along the line A—A in FIG. 24 wherein the conductive sheet and the dielectric film shown in FIGS. 23 and 24, are laminated. FIGS. 26, 29 and 32 are plans of the other conductive foils, FIGS. 27, 30 and 33, plans of the other dielectric films, and FIGS. 28, 31 and 34, sectional diagrams taken along the lines A—A in FIGS. 27, 30 and 33, wherein the conductive sheets and the dielectric films shown in FIGS. 26, 27, 29, 30, 32 and 33, are laminated. FIG. 35 is a connection diagram of the conductive sheets in FIGS. 23, 26, 29 and 32, and FIG. 36, an equivalent circuit of the LC filter according to the present invention.

In FIGS. 23 through 36, a notation 1 designates a conductive sheet, 20a, 20b, 20c, 20d, 20e, 20f, 20g and 20h, terminals, 17, a core insertion hole, 4, a dielectric film, 5a and 5b, holes for connecting the conductive sheets, 6, a protrusion for positioning, 7a and 7b, inductances, and 12, an inter-cable condenser.

Figure 36:
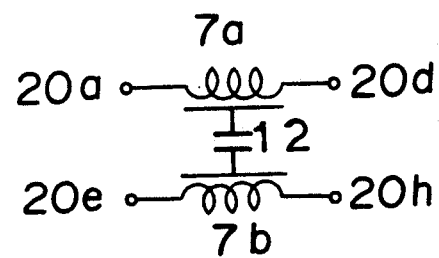
FIG. 36 is an equivalent circuit diagram of the embodiment 11 according to the present invention.

In FIGS. 23, 26, 29 and 32, a notation 1 designates a conductive sheet a portion of which is cut off from an opening to a periphery thereof. At both cut-off edges of the conductive sheets 1, the terminals 20a, 20b, 20c, 20d, 20e, 20f, 20g and 20h are integrated with the conductive foils. The conductive sheet 1 in FIG. 23, forms a coil of 1 turn around the core insertion hole 17 which is provided at the central portion of the dielectric film 4, from the terminal 20a to the terminal 20b. Furthermore, the terminal 20b communicates with the terminal 20c through the holes for connecting conductive sheets shown in FIGS. 24, 25, 27 and 28, by connection thereto or by a conductive adhesive agent. The communication continues to the terminal 20d, thereby forming a coil of 2 turns, 7a. Similarly, the terminal 20e of the conductive sheet 1 of FIG. 26, communicates with the terminal 20g of FIG. 32 around the core insertion hole 17, through the holes 5b for connecting conductive sheets shown in FIGS. 27, 28, 30 and 31, at the terminal 20f, by contact thereto or by a conductive adhesive agent, and the communication continues to the terminal 20h, thereby forming a coil of 2 turns, 7b. In this way, the respective terminals 20a, 20b, 20c, . . . are connected, and the connection diagram is as shown in FIG. 35. The inter-cable condenser 12 is formed by the conductive sheets 1 of FIGS. 23 and 26, FIGS. 26 and 29, and FIGS. 29 and 32 and the dielectric films 4. Accordingly, the equivalent circuit of the LC filter of this invention is as shown in FIG. 36. Furthermore, by matching the protrusions 6 for positioning, which are installed at the dielectric films 4 of FIGS. 24, 27, 30 and 33, the positioning for connecting predetermined terminals becomes possible.

EMBODIMENT 12

Figure 37:
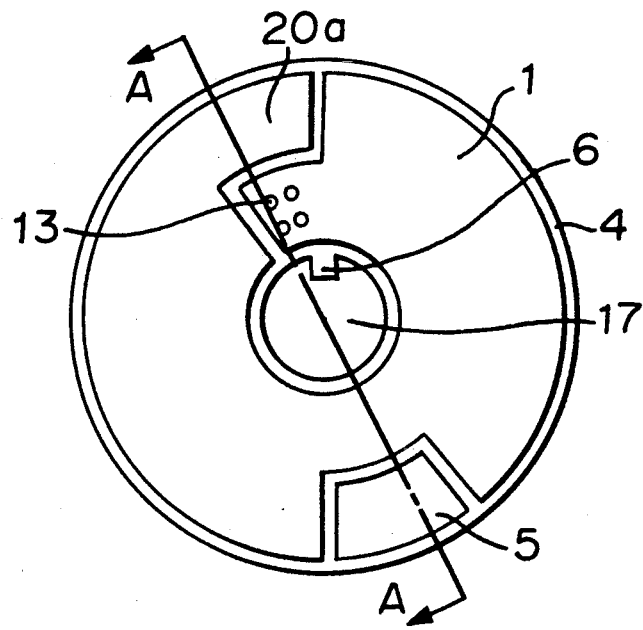
FIG. 37 is a top view showing a two-face-substrate of an embodiment 12 according to the present invention.
Figure 38:
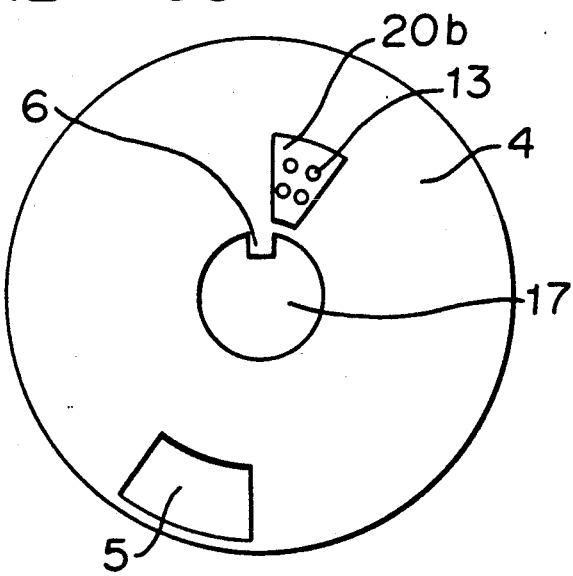
FIG. 38 is a bottom view showing the two-face-substrate of the embodiment 12 according to the present invention.
Figure 39:
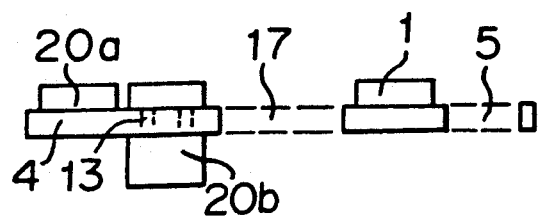
FIG. 39 is a sectional diagram of the two-face-substrate of the embodiment 12 according to the present invention.
Figure 40:
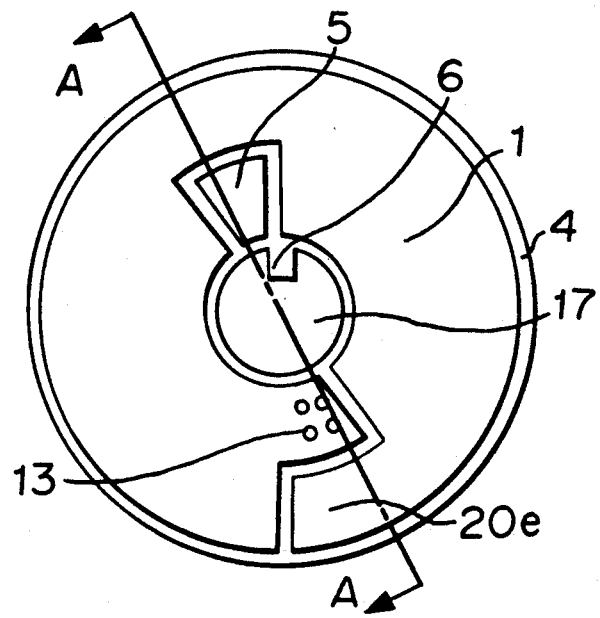
FIG. 40 is a top view showing another two-face-substrate of the embodiment 12 according to the present invention.
Figure 41:
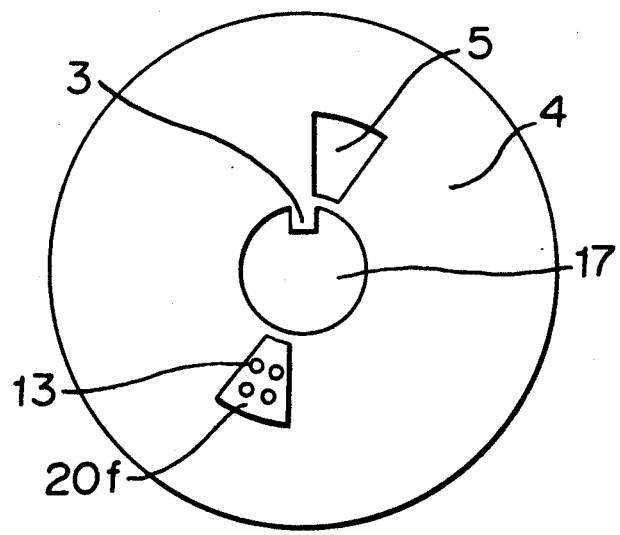
FIG. 41 is a bottom view showing the two-face-substrate of the embodiment 12 according to the present invention.
Figure 42:
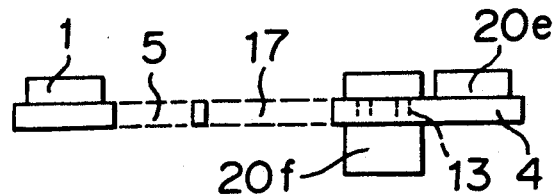
FIG. 42 is a sectional diagram of the two-face-substrate of the embodiment 12 according to the present invention.
Figure 43:
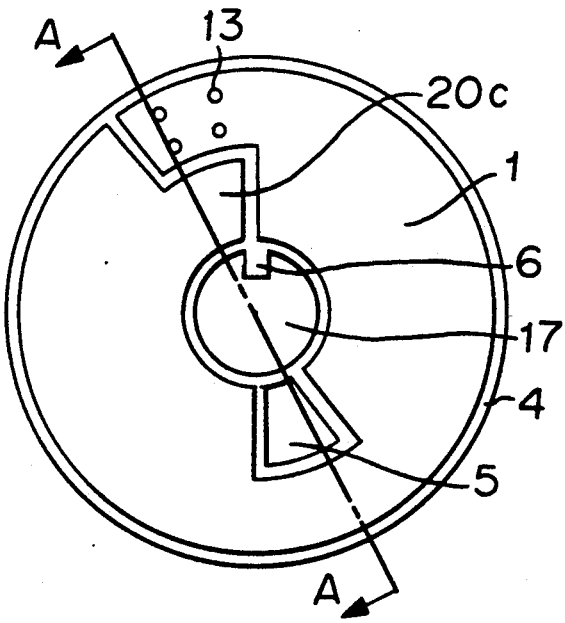
FIG. 43 is a top view showing another two-face-substrate of the embodiment 12 according to the present invention.
Figure 44:
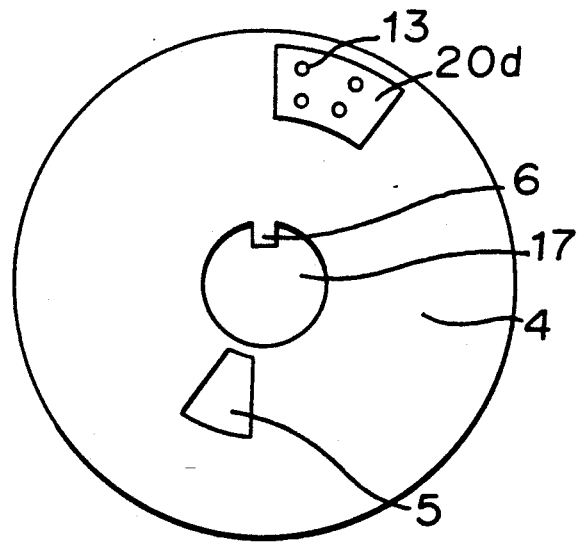
FIG. 44 is a bottom view showing the two-face-substrate of the embodiment 12 according to the present invention.
Figure 45:
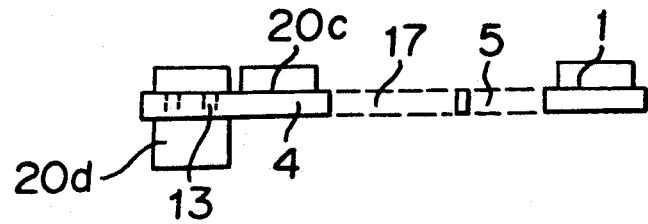
FIG. 45 is a sectional diagram of the two-face-substrate of the embodiment 12 according to the present invention.
Figure 46:
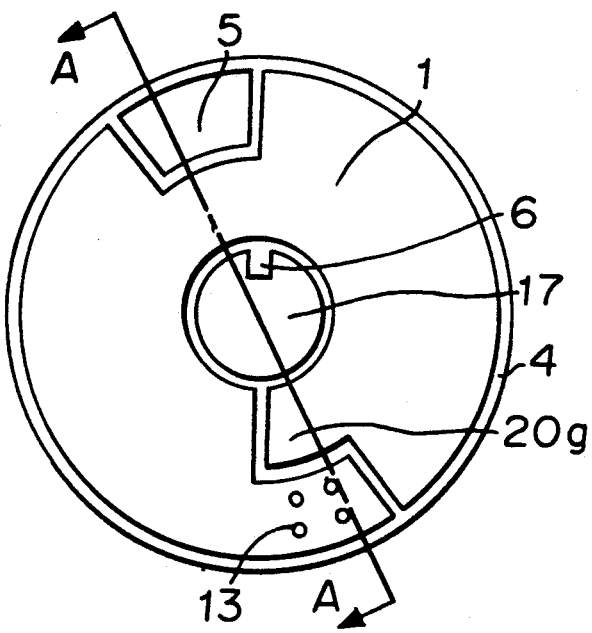
FIG. 46 is a top view showing another two-face-substrate of the embodiment 12 according to the present invention.
Figure 47:
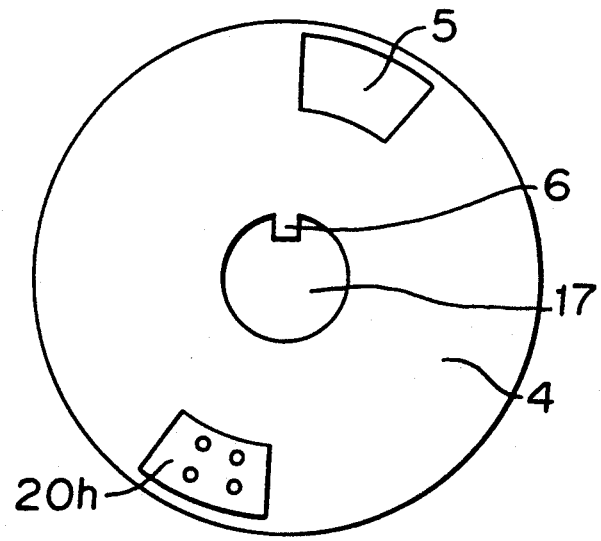
FIG. 47 is a bottom view showing the two-face-substrate of the embodiment 12 according to the present invention.
Figure 48:
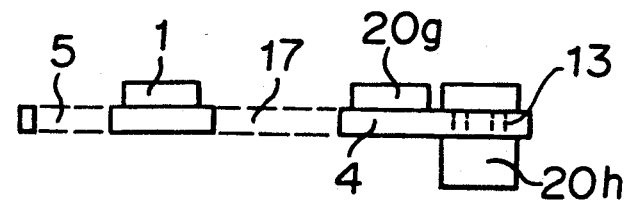
FIG. 48 is a sectional diagram showing the two-face-substrate of the embodiment 12 according to the present invention.

FIG. 37 is a top view of an embodiment of a two-face-substrate according to the present invention, FIG. 38, a bottom view of FIG. 37, and FIG. 39, a sectional diagram taken along the line A—A of FIG. 37. FIGS. 40, 43 and 46 are top views of the other two-face-substrates, FIGS. 41, 44 and 47, bottom views thereof, and FIGS. 42, 45 and 48, sectional diagrams taken along the lines A—A of FIGS. 40, 43 and 46.

In FIGS. 37 through 48, a notation 1 designates a conductive sheet, 20a, 20b, 20c, 20d, 20e, 20f, 20g and 20h, terminals, 17, a core insertion hole, 4, a dielectric film, 5a and 5b, holes for connecting the conductive sheets, 6, a protrusion for positioning and 13, a through hole, inside of which is plated with a highly conductive metal such as copper (hereinafter, through hole).

In FIGS. 37, 40, 43 and 46, a numeral 1 designates a ring-like conductive sheets a portion of which is cut off from an opening to a periphery thereof. On the respective cut-off ends and the other respective cut-off ends of these conductive sheets 1, and on the back surfaces which are connected to the top surfaces thereof through the through holes 13, the terminals 20a, 20b, 20c, . . . , are provided. The conductive sheet 1 of FIG. 37 forms a coil of 1 turn around the core insertion hole 17 which is provided at the central portion of the dielectric film 4 from the terminal 20a to the terminal 20b at the back surface thereof which is connected to the other cut-off end of the conductive sheet through the through hole 13. Furthermore, the terminal 20b communicates with the terminal 20c of FIG. 43 through the hole 5 for connecting conductive sheets of FIGS. 40, 41 and 42, by contact thereto or by a conductive adhesive agent, and the communication continues to the terminal 20d, thereby forming a coil of 2 turns. In this occasion, the thickness of the terminal 20b is larger than that of the conductive sheet 1 by those of the dielectric film 4 and the adhesive agent between the conductive sheet and the dielectric film 4, as shown in FIGS. 39, 42, 45 and 48. Therefore, good connection from terminal 20a to the terminal 20c is made possible. Similarly, the terminal 20e of the conductive sheet 1 in FIG. 40 communicates with the terminal 20g of FIG. 46 around the core insertion hole 17 through the through hole 13, which is connected to the terminal 20f of the back surface, of which thickness is controlled as in the terminal 20b, through the hole 5 for connecting conductive sheets shown in FIGS. 43, 44 and 45, by contact thereto or by a conductive adhesive agent, and the communication continues to the terminal 20h of FIG. 47 which is connected to the back surface thereof through the through hole 13, thereby forming a coil of 2 turns. In this way, the respective terminals 20a, 20b, 20c, . . . , are connected, and the connection diagram is as shown in FIG. 35, as in Embodiment 11. Furthermore, an intercable condenser is formed by the conductive sheets 1 in FIGS. 37 and 40, FIGS. 40 and 43, and FIGS. 43 and 46 and the dielectric films 4. Accordingly, the equivalent circuit of this LC filter of the present invention is as shown in FIG. 36, as in Embodiment 11. Furthermore, by matching the protrusions 6 for positioning which are installed in the dielectric films 4 in FIGS. 37, 40, 43 and 46, the positioning for connecting predetermined terminals, is made possible. Furthermore, in this embodiment, the shape of the conductive sheet is determined as ring-like. However, it is not necessary to restrict the peripheral shape to circle. This is also applicable to the following embodiments.

EMBODIMENT 13

Figure 49:
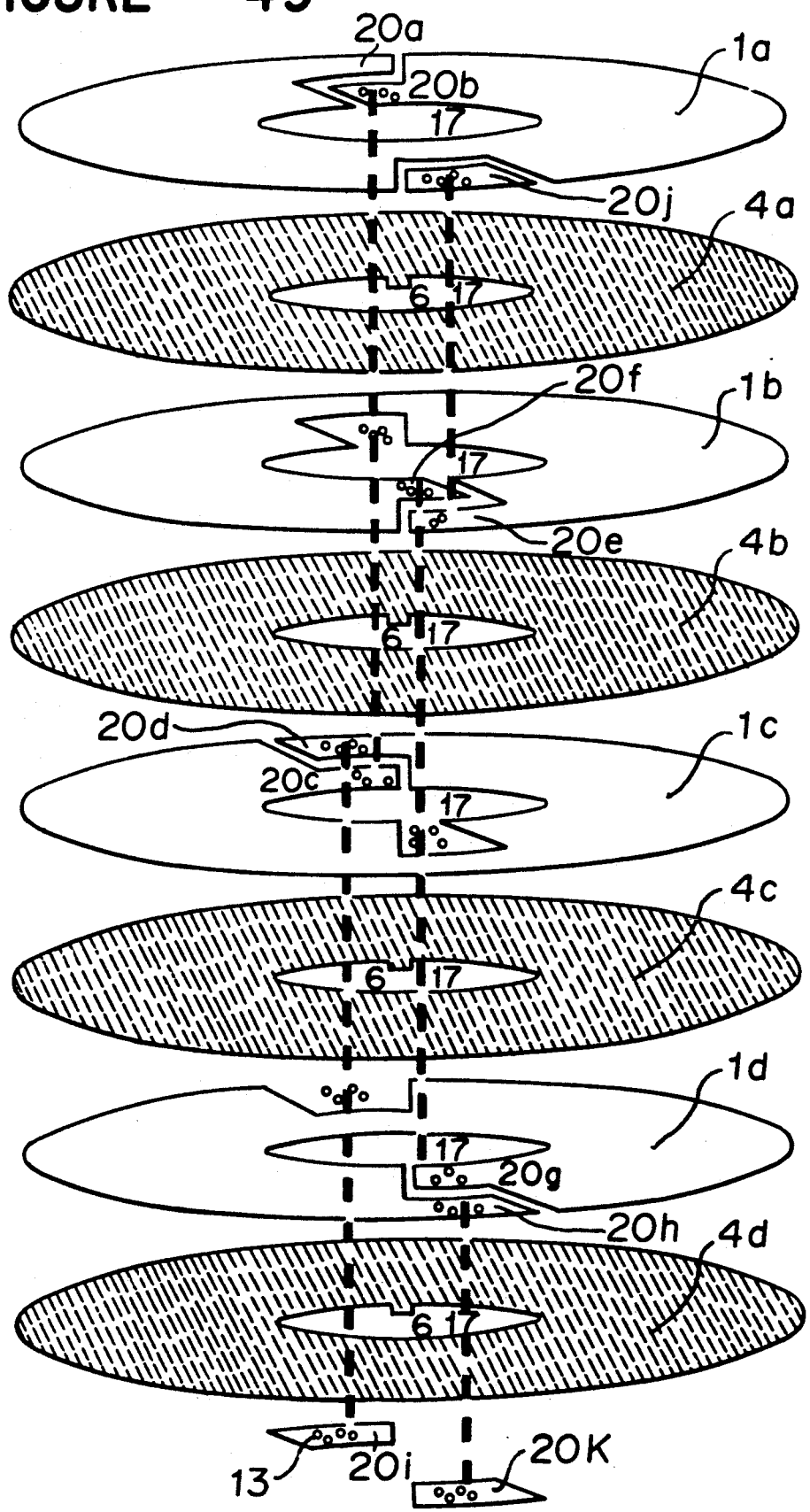
FIG. 49 is an exploded diagram of a multi-layer substrate of an embodiment 13 according to the present invention.

FIG. 49 is an exploded view of an embodiment of a multi-layer substrate of the present invention. In FIG. 49, notations 1a, 1b, 1c and 1d designate respectively conductive sheets of the first, the second, the third and the fourth layers, 20a, 20b, 20c, 20d, 20e, 20f, 20g, 20h, 20i, 20j, and 20k, terminals, 17, a core insertion hole, 4a, 4b, 4c and 4d, respectively dielectric films of the first, the second, the third and the fourth layer, 6, a protrusion for positioning, and 13, a through hole.

In FIG. 49, a notation 1 designates a ring-like conductive sheet a portion of which is cut off from an opening to a periphery thereof. Terminals 20a, 20b, . . . , are provided at both cut-off ends of the conductive sheets 1. The conductive sheet 1a of FIG. 49 forms a coil of 1 turn by communicating the terminal 20a to the terminal 20b at the other cut-off end, around the core insertion hole 17. The terminal 20b is communicated with the terminal 20c of the conductive sheet 1 of the third layer through the through holes 13, and the communication continues to the terminal 22d of the same layer thereby forming a coil of 2 turns, and to the terminal 20i again through the through holes 13. Furthermore, the terminal 20j of the first layer communicates with the terminal 20e provided at the conductive sheet 1b of the second layer through the through hole 13, and to the terminal 20k through the terminals 20f, 20g, and 20h, thereby forming a coil of 2 turns. The conductive sheets 1 of the first layer and the second layer, the second layer and the third layer, the third layer and the fourth layer compose an inter-cable condenser by interposing the dielectric films 4. Accordingly, the equivalent circuit for this embodiment is as shown in FIG. 36, as in Embodiment 11. By connecting the multi-layer substrates in one step or in multiple steps, the LC filter is composed. In this occasion, the protrusions 6 for positioning which are provided at the dielectric films 4, are matched, and terminal 20i of a multi-layer substrate is connected to the terminal 20a of the other multi-layer substrate, and the terminal 20k communicates with the terminal 20j of the other multi-layer substrate by contact thereto or by a conductive adhesive agent.

EMBODIMENT 14

Figure 50:
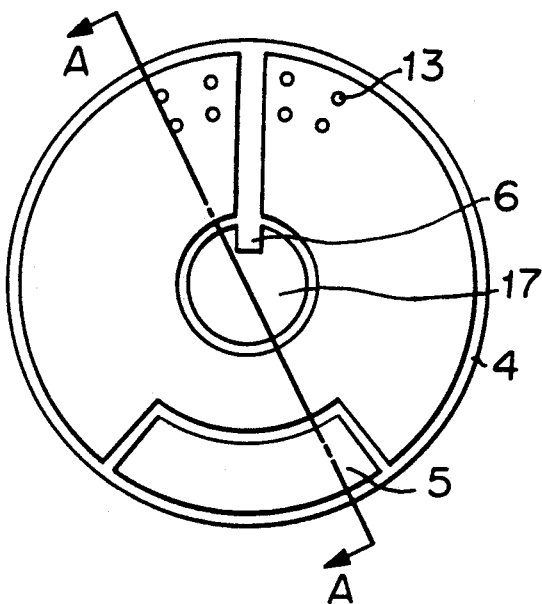
FIG. 50 is a top view showing a two-face-substrate of an embodiment 14 according to the present invention.
Figure 51:
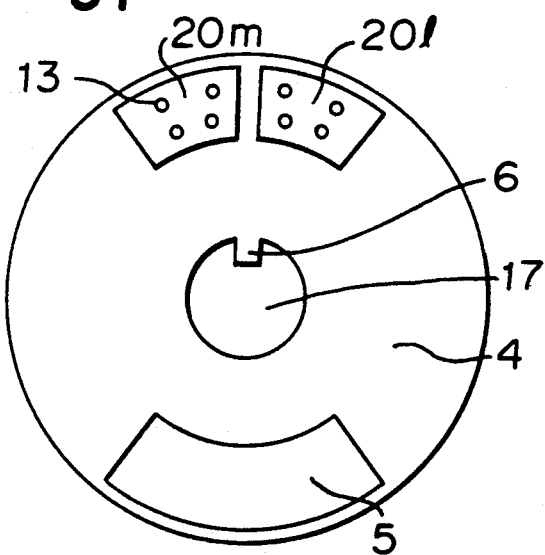
FIG. 51 is a bottom view showing the two-face-substrate of the embodiment 14 according to the present invention.
Figure 52:
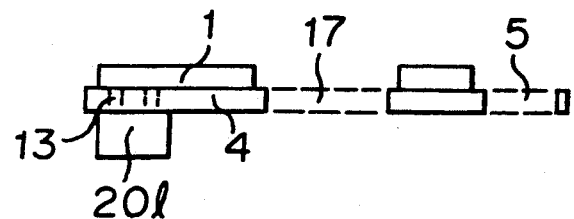
FIG. 52 is a sectional diagram of the two-face-substrate of the embodiment 14 according to the present invention.
Figure 53:
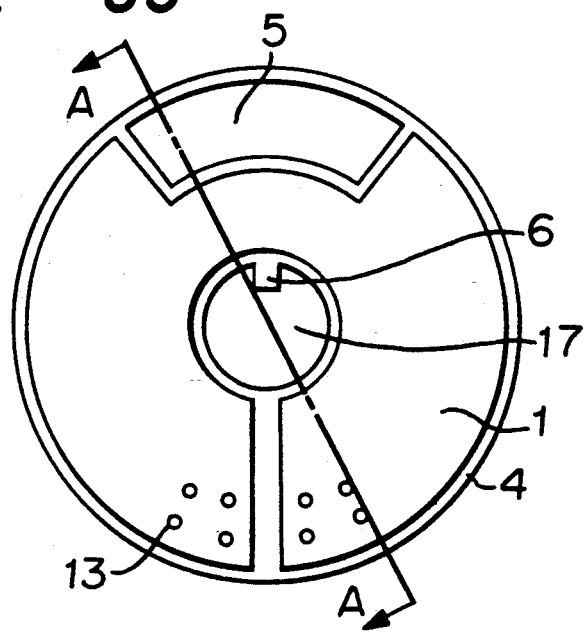
FIG. 53 is a top view showing another two-face-substrate of the embodiment 14 according to the present invention.
Figure 55:
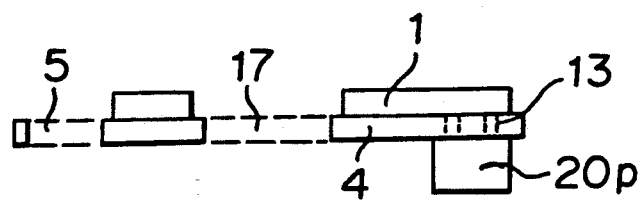
FIG. 55 is a sectional diagram of the two-face-substrate of the embodiment 14 according to the present invention.
Figure 56:
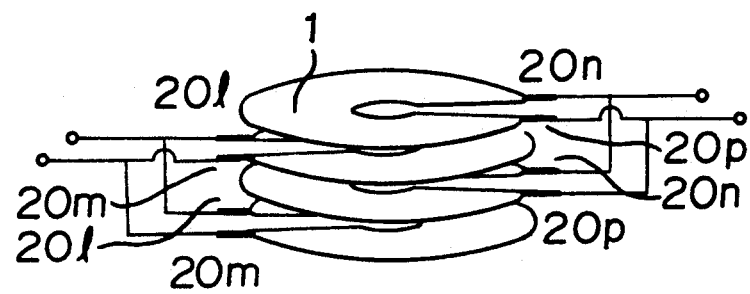
FIG. 56 is a connection diagram of conductive sheets of the embodiment 14 according to the present invention.

FIG. 50 is a top view of an embodiment of a two-face-substrate according to the present invention, FIG. 51, a bottom view of FIG. 50, and FIG. 52, a sectional diagram taken along the line A—A of FIG. 50. FIG. 53 is a top view of anther two-face-substrate, FIG. 54, a bottom view thereof, and FIG. 55, a sectional diagram taken along the line A—A of FIG. 53. Furthermore, FIG. 56 is a connection diagram of conductive sheets between those in FIG. 50 and those in FIG. 53, and FIG. 57, an equivalent circuit of an LC filter of the present invention.

In FIGS. 50 through 57, a notation 1 designates a conductive sheet, 20l, 20m, 20n and 20p, terminals, 17, a core insertion hole, 4, a dielectric film, 5, a hole for connecting the conductive sheets, 6, a protrusion for positioning, 12, an inter-cable condenser, and 13, a through hole.

Figure 54:
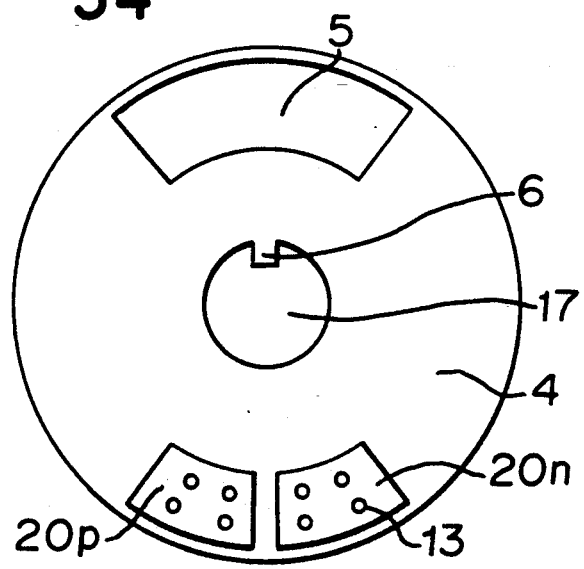
FIG. 54 is a bottom view showing the two-face-substrate of the embodiment 14 according to the present invention.
Figure 57:
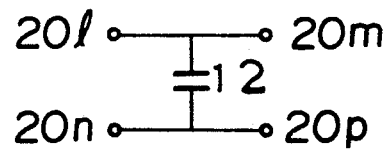
FIG. 57 is an equivalent circuit diagram of the embodiment 14 according to the present invention.

In FIGS. 50 and 53, a numeral 1 designates a ring-like conductive sheet a portion of which is cut off from an opening to a periphery thereof. Terminals 20m, 20l, 20n and 20p are provided at both cut-off ends of the conductive sheets 1 and the back surfaces connected by the through holes 13. A plurality of two-face-substrates of FIG. 50 are provided, and two of the terminals 20l and two of the terminals 20m of FIG. 51 are connected by contact thereto or by a conductive adhesive agent, that is, a plurality of conductive sheets 1 are connected in parallel. Similarly, a plurality of two-face-substrates of FIG. 53 are provided, and two of the terminals 20n and two of the terminals 20p of FIG. 54 are connected by contact thereto or by a conductive adhesive agent. In this connection, by matching the protrusions 6 for positioning which are attached to the dielectric films 4 shown in FIGS. 50, 51, 53 and 54, the positioning for connecting predetermined terminals is made possible. The thickness of the terminals 20l and 20p is larger than that of conductive sheet 1 by those of the dielectric film 4 and the adhesive between the conductive sheet and the dielectric film 4. Therefore, good connection is made possible among these terminals. By alternatively laminating, two pairs of conductive sheets 1 which are parallely connected as above, as in the connection diagram of FIG. 56, an inter-cable condenser 12 is composed as shown in FIG. 57. In this construction, the protrusions 6 for positioning are utilized for positioning the substrates as in the connection between each of the same two-face-substrates, and a terminal of a substrate is connected to another terminal, which is provided at another substrate and of which thickness is controlled, through the hole 5 for connecting conductive sheets.

EMBODIMENT 15

Figure 58:
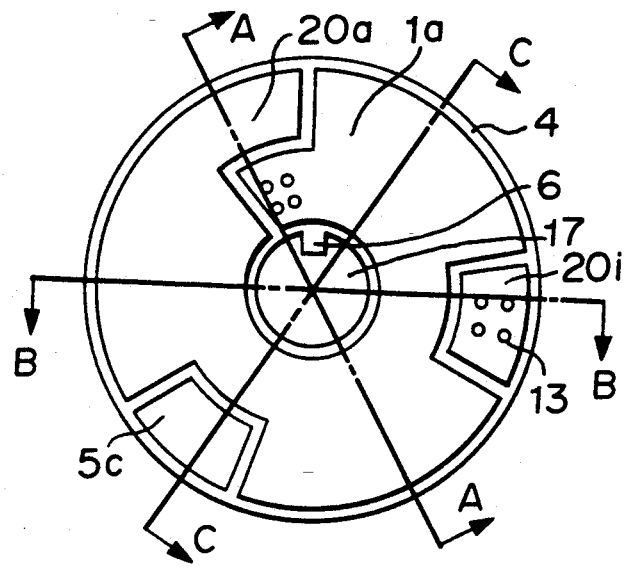
FIG. 58 is a top view showing a two-face-substrate of an embodiment 15 according to the present invention.
Figure 59:
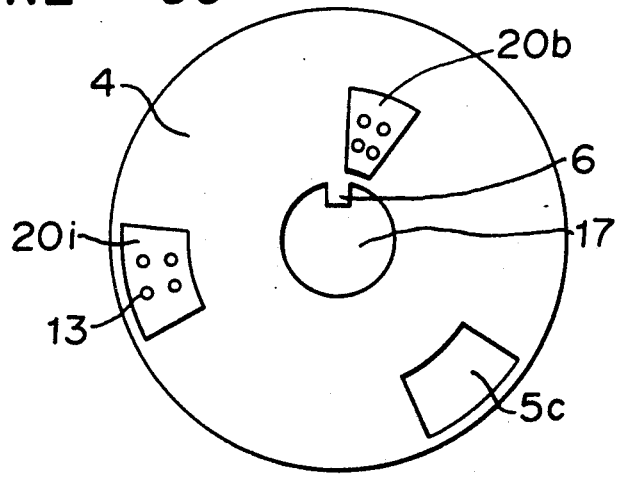
FIG. 59 is a bottom view showing the two-face-substrate of the embodiment 15 according to the present invention.
Figure 60:
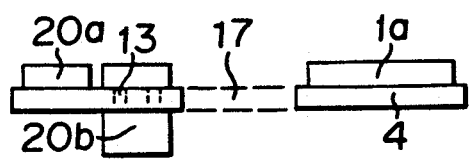
FIG. 60 is a sectional diagram of the two-face-substrate of the embodiment 15 according to the present invention.
Figure 61:
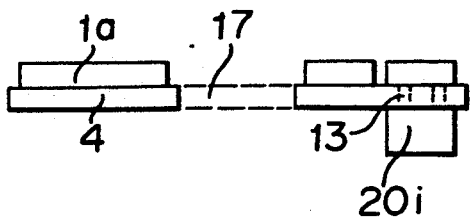
FIG. 61 is another sectional diagram of the two-face-substrate of the embodiment 15 according to the present invention.
Figure 62:
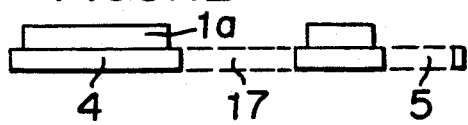
FIG. 62 is another sectional diagram of the two-face-substrate of the embodiment 15 according to the present invention.
Figure 98:
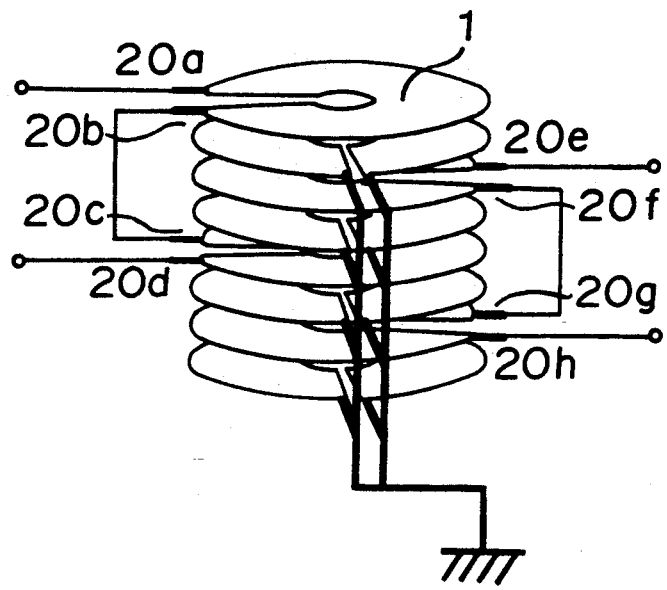
FIG. 98 is a connection diagram of conductive sheets of the embodiment 15 according to the present invention.

FIG. 58 is a top view of an embodiment of a two-face-substrate of the present invention, FIG. 59, a bottom view of FIG. 58, FIGS. 60, 61 and 62, sectional diagrams taken along the line A—A, the line B—B, and the line C—C of FIG. 58, respectively. FIGS. 63, 68, 73, 78, 83, 88 and 93 are top views of the other two-face-substrates, FIGS. 64, 69, 74, 79, 84, 89 and 94, bottom views thereof, FIGS. 65 through 67, FIGS. 70 through 72, FIGS. 75 through 77, FIGS. 80 through 82, FIGS. 85 through 87, FIGS. 90 through 92, and FIGS. 95 through 97, sectional diagrams taken along respectively the lines A—A, the lines B—B, and the lines C—C of FIGS. 63, 68, 73, 78, 83, 88 and 93. FIG. 98 is a connection diagram of the conductive sheets of the two-face-substrates, and FIG. 99, an equivalent circuit of the LC filter of this invention.

In FIGS. 58 through 99, notations 1a and 1b designate conductive sheets, 20a, 20b, 20c, 20d, 20e, 20f, 20g, 20h, 20i, 20q, 20r, 20s, 20t, 20u, 20v and 20w, terminals, 17, a core insertion hole, 4, a dielectric film, 5a, 5b and 5c, holes for connecting conductive sheets, 6, a protrusion for positioning, 7a and 7b, inductances, 13, a through hole and 10 and 11, cable-to-earth condensers.

In FIGS. 58, 68, 78 and 88, a notation 1a designates a conductive sheet a portion of which is cut off from an opening to a periphery thereof. Terminals 20b, 20i, 20u, 20f, 20d, 20v, 20w and 20h are provided on back surfaces connected to ones and another ones of cut-off edges through the through holes 13. The conductive sheet 1a of FIG. 58 forms a coil of 1 turn by communicating the terminal 20a with the terminal 20b on the back surface which is connected to the other cut-off end through the through hole 13, around the core insertion hole 17 provided at the central part of the dielectric film 4. Furthermore, the terminal 20b communicates with the terminal 20u of FIG. 68 through the hole 5a for connecting conductive sheets of FIGS. 63, 64 and 65, by contact thereto or by a conductive adhesive agent, and the communication continues by passing through the hole 5a for connecting conductive sheets of FIGS. 73 through 75, to the terminal 20b by contact thereto or by a conductive adhesive agent, thereby forming a coil 7a of 2 turns. Furthermore, the communication continues to the terminal 20w of FIG. 88 passing through the hole 5a for connecting conductive sheets of FIGS. 83 through 85. The thicknesses of the terminals 20b, 20u, 20d and 20w are larger than those of the conductive sheets 1a by the thickness of the conductive film 4 and an adhesive agent between the conductive sheet and the dielectric film 4, as shown in FIGS. 60, 70, 80 and 90. Therefore, good connection is made possible among terminals. Similarly, the conductive sheet 1a of FIG. 68 forms a coil of 1 turn by communicating the terminal 20i of FIG. 58 with the terminal 20e through the hole 5b for connecting conductive sheets of FIGS. 63, 64 and 66, by contact thereto or by a conductive adhesive agent, and by the communication continuing to the terminal 20f of the back surface which is connected to the other cut-off end through the through hole 13. Furthermore, the terminal 20f communicates with the terminal 20v of FIG. 78 through the hole 5b for connecting conductive sheets of FIGS. 73, 74 and 76, and by contact thereto or by a conductive adhesive agent, and by the communication continuing to the terminal 20g of FIG. 88 through the 84 and 86, and to the terminal 20h, thereby forming the coil 7b of 2 turns. The thicknesses of the terminals 20i, 20f, 20v and 20h are larger than that of the conductive sheet 1a, by the thickness of the dielectric film 4 and an adhesive agent between the conductive sheet and the dielectric film 4, as shown in FIGS. 61, 71, 81 and 91. Therefore, good connection is made possible among respective terminals.

Figure 63:
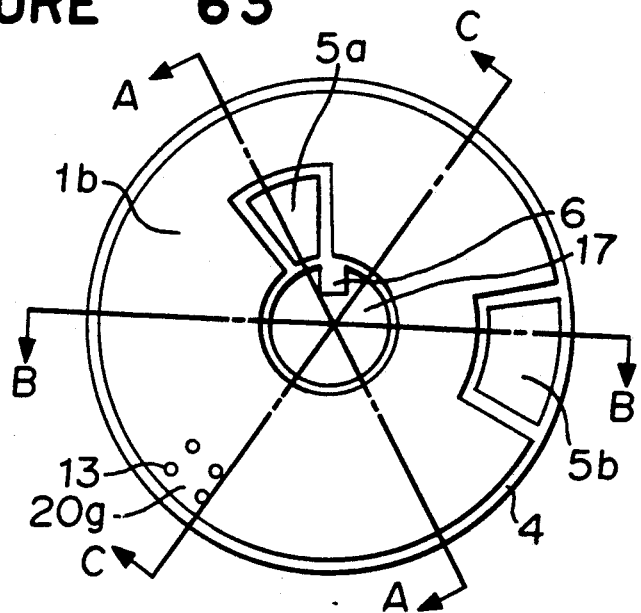
FIG. 63 is a top view showing another two-face-substrate of the embodiment 15 according to the present invention.
Figure 64:
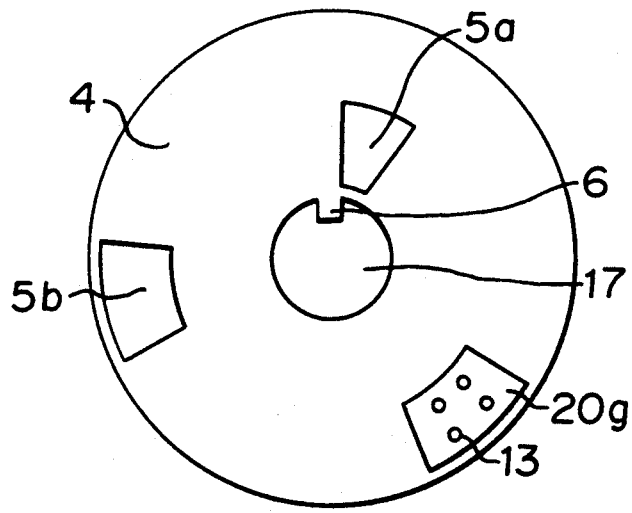
FIG. 64 is a bottom view showing the two-face-substrate of the embodiment 15 according to the present invention.
Figure 65:
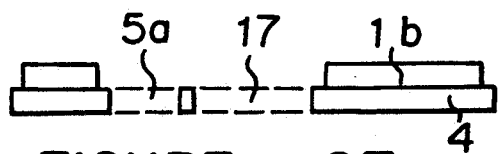
FIG. 65 is a sectional diagram of the two-face-substrate of the embodiment 15 according to the present invention.
Figure 66:
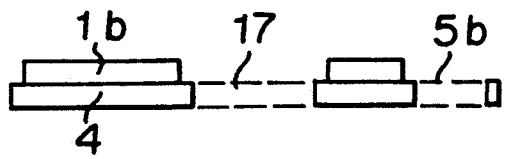
FIG. 66 is another sectional diagram of the two-face-substrate of the embodiment 15 according to the present invention.
Figure 67:
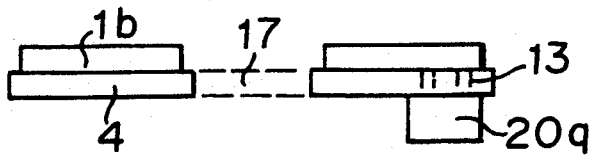
FIG. 67 is another sectional diagram of the two-face-substrate of the embodiment 15 according to the present invention.
Figure 68:
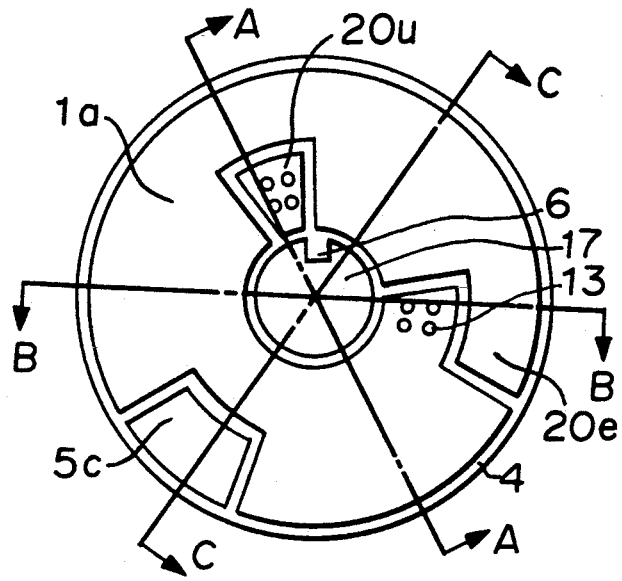
FIG. 68 is a top view showing another two-face-substrate of the embodiment 15 according to the present invention.
Figure 69:
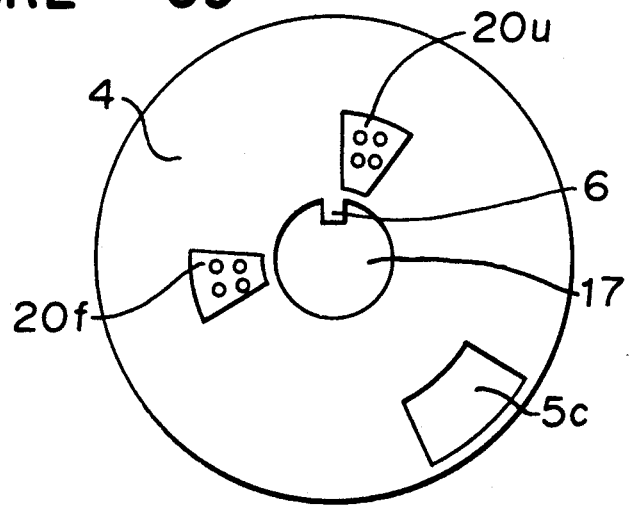
FIG. 69 is a bottom view showing the two-face-substrate of the embodiment 15 according to the present invention.
Figure 70:
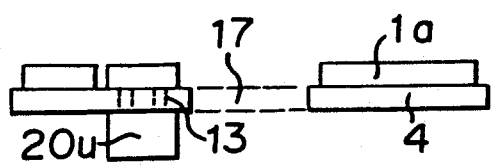
FIG. 70 is a sectional diagram of the two-face-substrate of the embodiment 15 according to the present invention.
Figure 71:
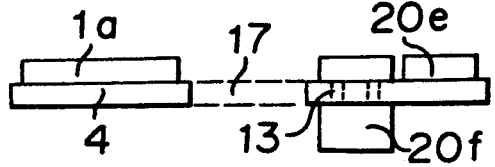
FIG. 71 is another sectional diagram of the two-face-substrate of the embodiment 15 according to the present invention.
Figure 72:
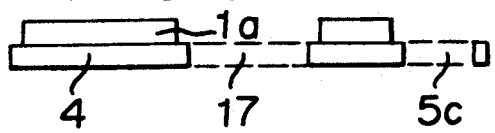
FIG. 72 is another sectional diagram of the two-face-substrate of the embodiment 15 according to the present invention.
Figure 73:
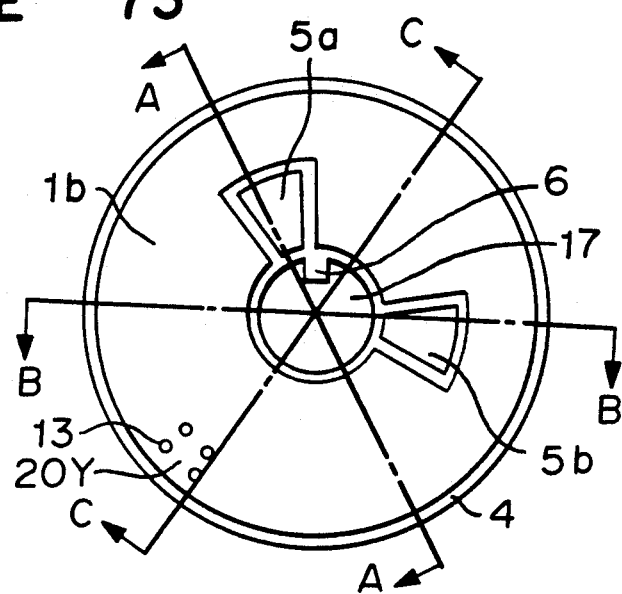
FIG. 73 is a top view showing another two-face-substrate of the embodiment 15 according to the present invention.
Figure 74:
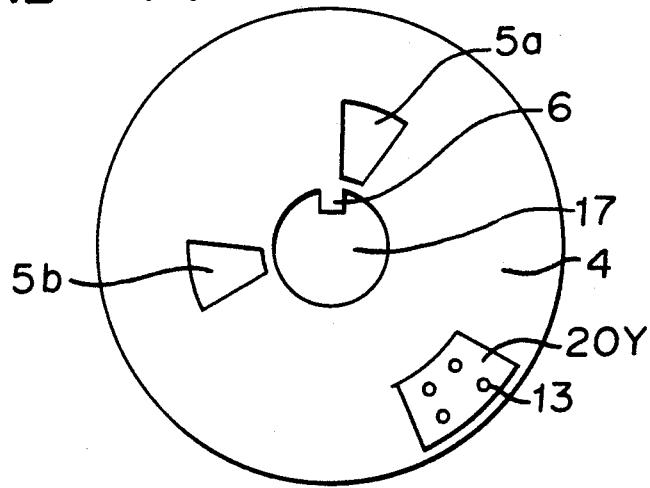
FIG. 74 is a bottom view showing the two-face-substrate of the embodiment 15 according to the present invention.
Figure 75:
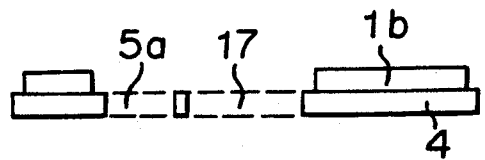
FIG. 75 is a sectional diagram of the two-face-substrate of the embodiment 15 according to the present invention.
Figure 76:
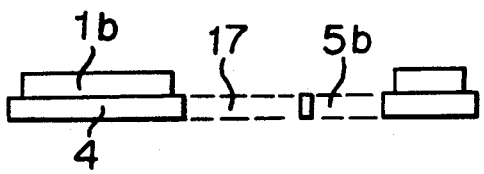
FIG. 76 is another sectional diagram of the two-face-substrate of the embodiment 15 according to the present invention.
Figure 77:
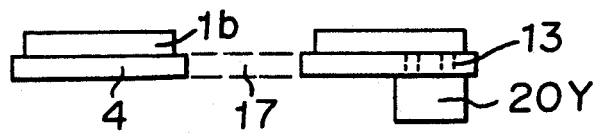
FIG. 77 is another sectional diagram of the two-face-substrate of the embodiment 15 according to the present invention.
Figure 78:
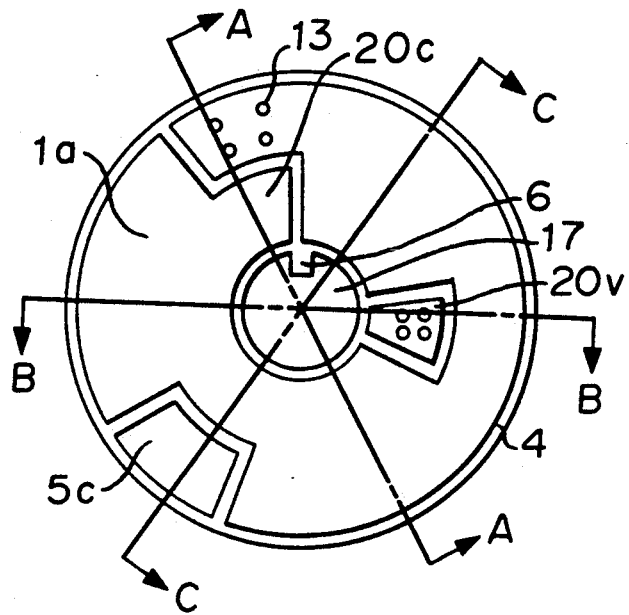
FIG. 78 is a top view showing another two-face-substrate of the embodiment 15 according to the present invention.
Figure 79:
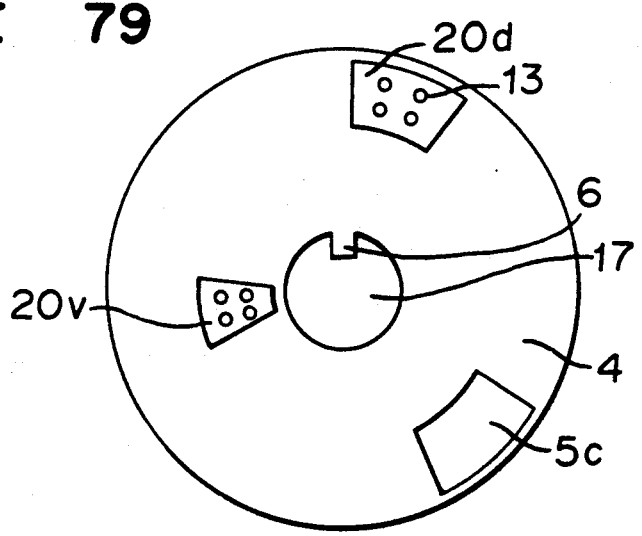
FIG. 79 is a bottom view showing the two-face-substrate of the embodiment 15 according to the present invention.
Figure 80:
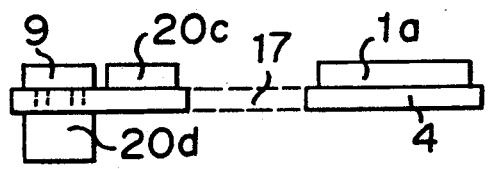
FIG. 80 is a sectional diagram of the two-face-substrate of the embodiment 15 according to the present invention.
Figure 81:
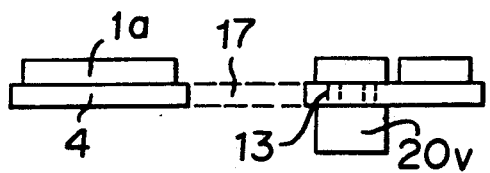
FIG. 81 is another sectional diagram of the two-face-substrate of the embodiment 15 according to the present invention.
Figure 82:
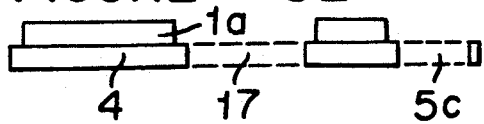
FIG. 82 is another sectional diagram of the two-face-substrate of the embodiment 15 according to the present invention.
Figure 83:
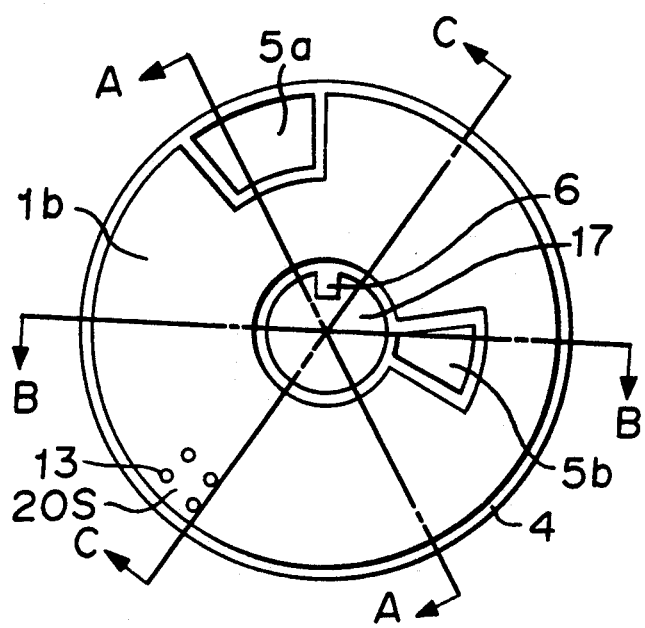
FIG. 83 is a top view showing another two-face-substrate of the embodiment 15 according to the present invention.
Figure 84:
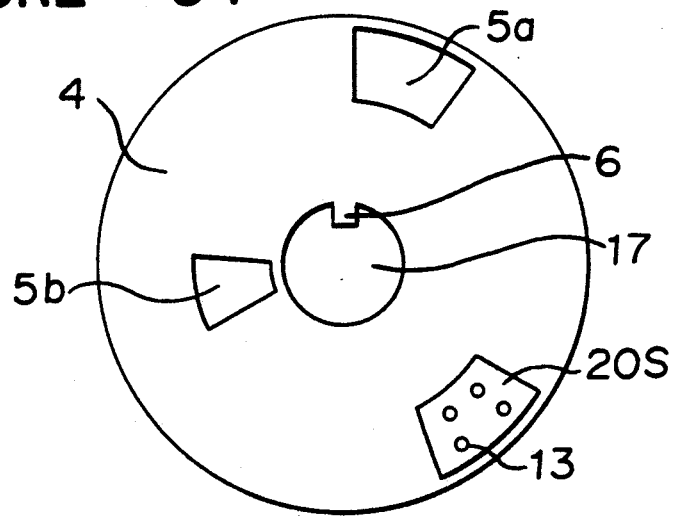
FIG. 84 is a bottom view showing the two-face-substrate of the embodiment 15 according to the present invention.
Figure 85:
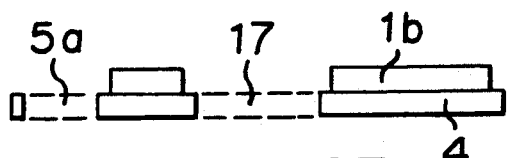
FIG. 85 is a sectional diagram of the two-face-substrate of the embodiment 15 according to the present invention.
Figure 86:
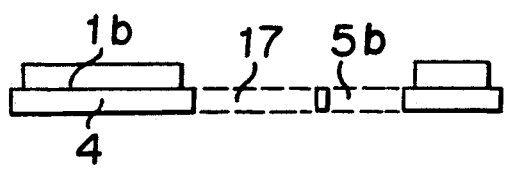
FIG. 86 is another sectional diagram of the two-face-substrate of the embodiment 15 according to the present invention.
Figure 87:
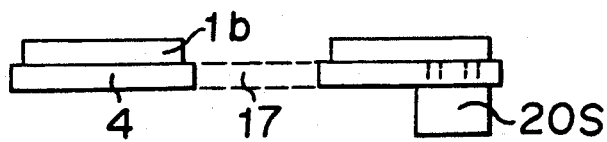
FIG. 87 is another sectional diagram of the two-face-substrate of the embodiment 15 according to the present invention.
Figure 88:
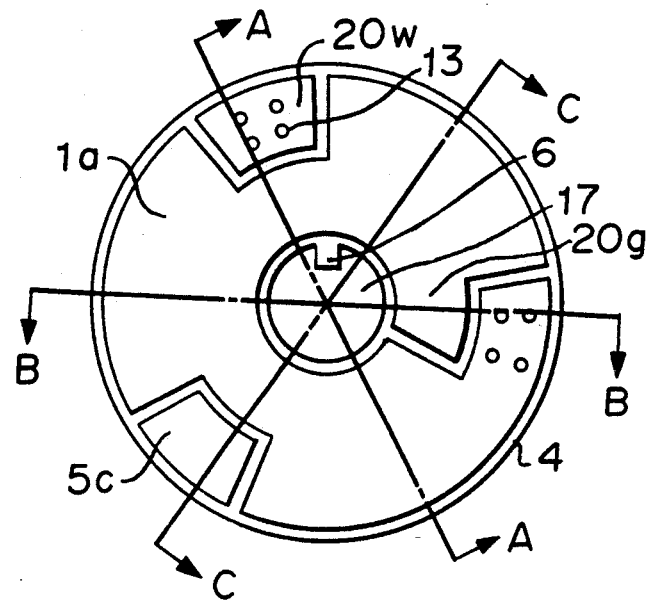
FIG. 88 is a top view showing another two-face-substrate of the embodiment 15 according to the present invention.
Figure 89:
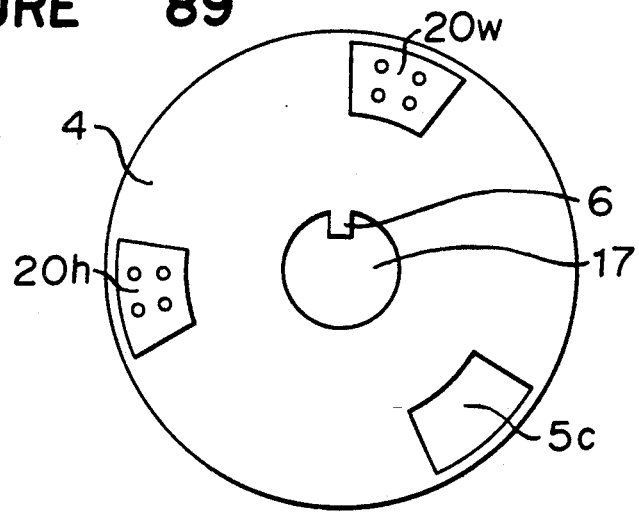
FIG. 89 is a bottom view showing the two-face-substrate of the embodiment 15 according to the present invention.
Figure 90:
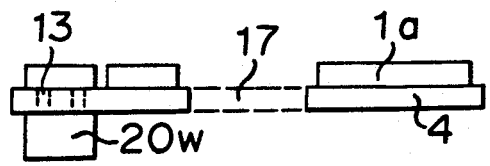
FIG. 90 is a sectional diagram of the two-face-substrate of the embodiment 15 according to the present invention.
Figure 91:
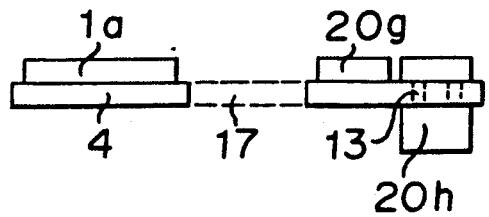
FIG. 91 is another sectional diagram of the two-face-substrate of the embodiment 15 according to the present invention.
Figure 92:
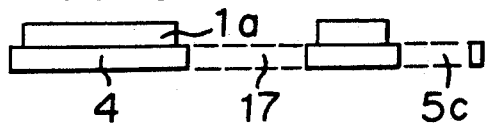
FIG. 92 is another sectional diagram of the two-face-substrate of the embodiment 15 according to the present invention.
Figure 93:
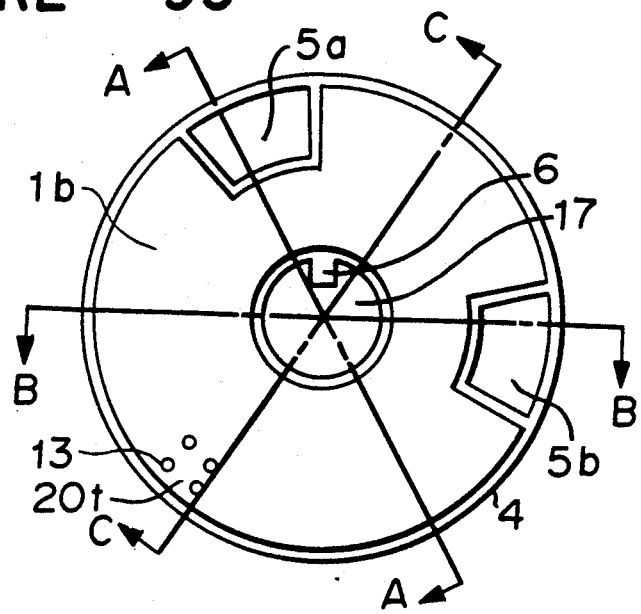
FIG. 93 is a top view showing another two-face-substrate of the embodiment 15 according to the present invention.
Figure 94:
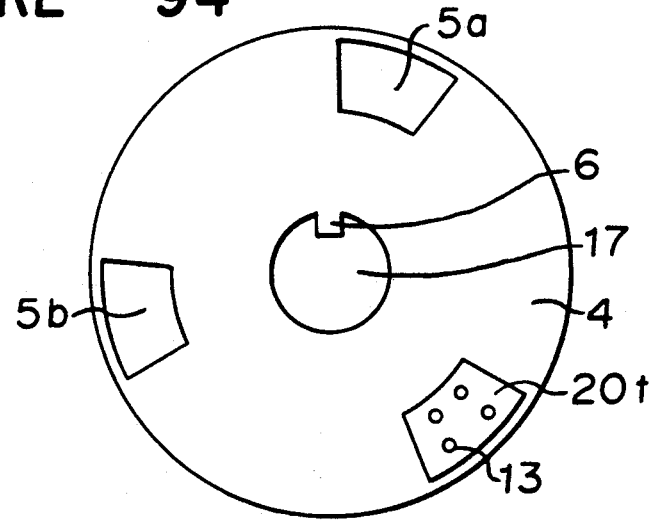
FIG. 94 is a bottom view showing the two-face-substrate of the embodiment 15 according to the present invention.
Figure 95:
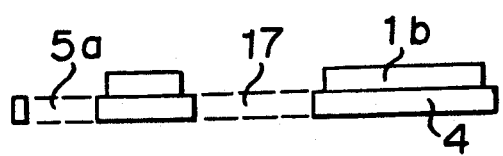
FIG. 95 is a sectional diagram of the two-face-substrate of the embodiment 15 according to the present invention.
Figure 96:
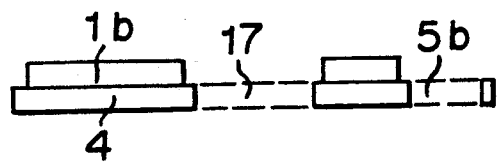
FIG. 96 is another sectional diagram of the two-face-substrate of the embodiment 15 according to the present invention.
Figure 97:
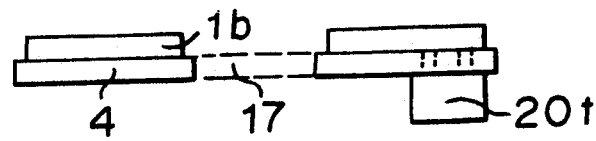
FIG. 97 is another sectional diagram of the two-face-substrate of the embodiment 15 according to the present invention.

In the conductive sheet 1b of FIG. 63, the terminal 20q is provided at the through hole 13, which communicates with the terminal 20r through the hole 5c for connecting conductive sheets of FIGS. 68, 69 and 72, by contact thereto or by conductive adhesive agent, and the communication continues to the terminal 20s of FIG. 83 through the hole 5c for connecting conductive sheets of FIGS. 78, 79 and 82, by contact thereto or by a conductive adhesive agent, and to the terminal 20t of FIG. 93 through the hole 5c for connecting conductive sheets of FIGS. 88, 89 and 92, by contact thereto or by a conductive adhesive agent, and finally to the ground.

Figure 99:
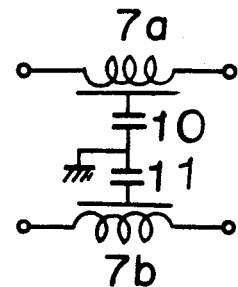
FIG. 99 is an equivalent circuit of the embodiment according to the present invention.

In this way, the respective terminals are connected and the wiring diagram is as shown in FIG. 98. Cable-to-earth condensers 10 and 11 are composed by conductive sheets 1 between FIGS. 58 and 63, FIGS. 63 and 68, FIGS. 68 and 73, FIGS. 73 and 78, FIGS. 78 and 83, FIGS. 83 and 88, and FIGS. 88 and 93 and the dielectric films 4. Accordingly, the equivalent circuit of this LC filter is as shown in FIG. 99.

Furthermore, by matching the protrusions 6 for positioning which are installed at the dielectric films 4 for the respective two-face-substrates, the positioning for connecting predetermined terminals is made possible.

Figure 100:
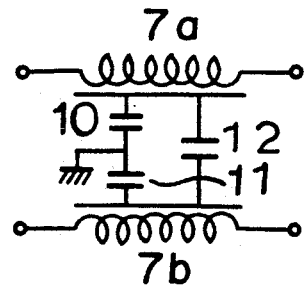
FIG. 100 is another equivalent circuit of the embodiment 15 according to the present invention.
Figure 101:
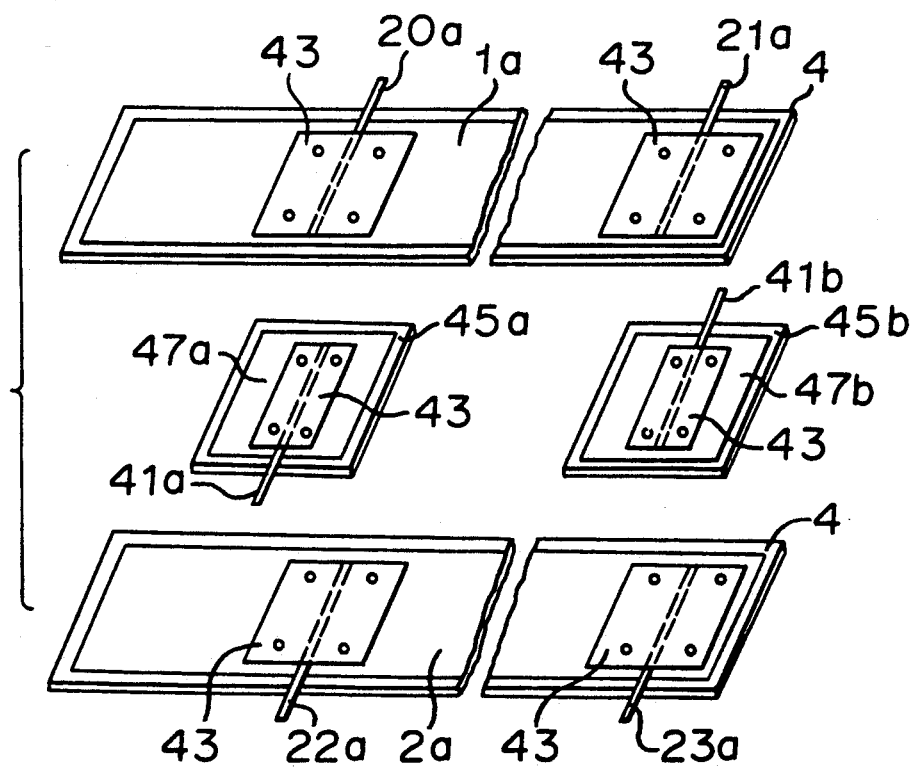
FIG. 101 is an exploded view of a conventional noise filter.
Figure 102:
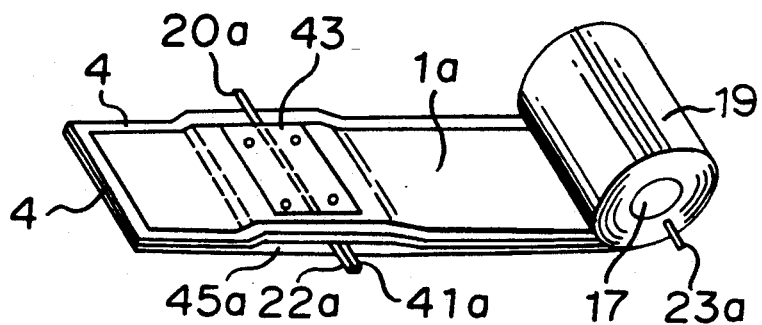
FIG. 102 is a perspective view of the conventional noise filter.
Figure 103:
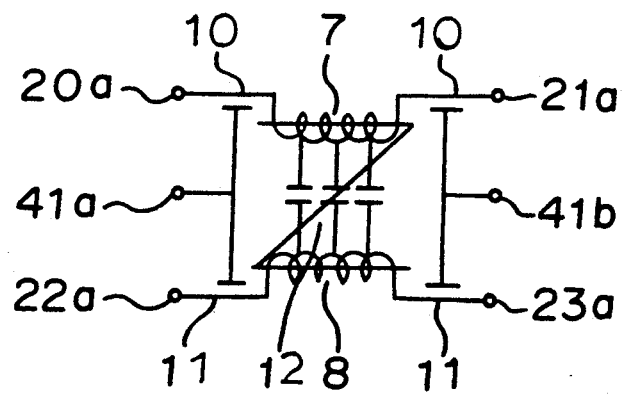
FIG. 103 is an equivalent circuit diagram of the conventional noise filter.

A new LC filter is composed by performing a single step or a multi-step connection of the LC filters composed as above, in series, and by connecting thereto in series the respective filters in Embodiment 12 and Embodiment 14. In this filter, the respective constants of the LC filter can be set independently by controlling number of conductive sheets which are laminated in multi-steps in the respective filters, of the first filter wherein the conductive sheets for inductances and for inter-cable condensers, are connected in series, the second filter wherein the conductive sheets for the cable-to-earth condenser are connected in parallel, and the third filter wherein the other conductive sheets and the dielectric sheets are inserted between the respective conductive sheets for the cable-to-earth condenser and the inductances, and the inserted conductive sheets are earthed. FIG. 100 is an equivalent circuit diagram of such an LC filter.

Since this invention is composed as explained as above, the invention has the following effects.

Since this LC filter is made by the coiling method or by the laminating method, provided with the third conductive sheets, as well as the first and the second conductive sheets, the third conductive sheets shield the first and the second conductive sheet layers, the distributed capacitance is reduced, the resonance frequency of the coil is increased, and the high frequency characteristic of the LC filter is improved.

Furthermore, as for the laminating type LC filter, the magnetic sheets inserted between the conductive sheets, have an effect similar to the added-magnetic-beads effect, and similarly improve the high frequency characteristic.

Furthermore, in the LC filter made by laminating the ring-like conductive sheets a portion of each of which is cut off from an opening to a periphery thereof and the dielectric films, the coiling operation of the conductive sheets and the dielectric films is not necessary, which facilitates the production of the LC filter.

Furthermore, the LC filter of a target characteristic can easily be obtained by connecting two kinds of filters having different unit compositions of inductances and capacitances in arbitrary numbers respectively, and by combining these two multi-layer LC filters.

Furthermore, the LC filter is realized by laminating the conductive sheets which form inductance and capacitance, in multi-layers, wherein it is not necessary to take out the terminals, the automation of the production is enabled, and the production cost is reduced.

Furthermore, in case of the two-face-substrate, good connection is enabled even in case of connecting the conductive sheets in multi-steps, by increasing the thickness of the terminal on the back surface thereof larger than the terminal thickness of the top surface by the thickness of the dielectric film layer.

The promotion of the characteristic of the filter is made possible since the inductance and the capacitance can independently be set.

We claim:

1. An LC filter which comprises:
   first and second conductive sheets each having a ring-like shape, said ring-like conductive sheets each further having a portion which is cut off from an inner opening thereof to an outer periphery thereof; and
   a dielectric film interposed between the first and the second conductive sheets;
   wherein the first and the second conductive sheets are respectively provided with input terminals and output terminals.

2. The LC filter according to claim 1, wherein said input terminals and said output terminals are respectively provided at each of edges of the cut-off portions of the first and the second conductive sheets and on radial lines passing through centers of the first and the second conductive sheets.

3. An LC filter which comprises:

a plurality of conductive sheets each having an opening provided at a central portion of the conductive sheet, a cut-off portion provided from the opening to a periphery of the conductive sheet, and terminals at edges of the cut-off portion; and a plurality of dielectric sheets;

wherein a laminated body is composed of the plurality of conductive sheets and the plurality of dielectric sheets which are alternatively laminated.

* * * * *

UNITED STATES PATENT AND TRADEMARK OFFICE
CERTIFICATE OF CORRECTION

PATENT NO. : 5,227,746
DATED : July 13, 1993
INVENTOR(S) : Mitsunobu Esaki et al.

It is certified that error appears in the above-indentified patent and that said Letters Patent is hereby corrected as shown below:

On the title page, Item [30],

The third Foreign Application Number is incorrect, should read:

--3-324443--

Signed and Sealed this

Nineteenth Day of April, 1994

Attest:

BRUCE LEHMAN

Attesting Officer

Commissioner of Patents and Trademarks